United States Patent [19]

Coggins et al.

[11] Patent Number: 5,414,365
[45] Date of Patent: May 9, 1995

[54] DIAGNOSTIC APPARATUS FOR TESTING AN ANALOG CIRCUIT

[75] Inventors: Timothy R. Coggins, Winter Park; Michael Dalbey, Edgewater; Joseph Groszek, Winter Park; Charles A. Contarino, Casselberry; George L. Roth, Apopka, all of Fla.

[73] Assignee: Martin Marietta Corporation, Bethesda, Md.

[21] Appl. No.: 950,693

[22] Filed: Sep. 25, 1992

[51] Int. Cl.6 ............................................. G01R 1/04
[52] U.S. Cl. .................................................. 324/607
[58] Field of Search .................. 324/73.1, 678, 658, 324/548

[56] References Cited

U.S. PATENT DOCUMENTS

| | | | |
|---|---|---|---|
| 4,155,116 | 5/1979 | Tawfik et al. | 364/119 |
| 4,184,205 | 1/1980 | Morrow | 364/508 |
| 4,242,751 | 12/1980 | Henckels et al. | 324/73 |
| 4,454,500 | 6/1984 | Kato et al. | 340/347 AD |
| 4,544,879 | 8/1985 | Maeda et al. | 324/73 |
| 4,656,632 | 4/1987 | Jackson | 324/73 |
| 4,701,920 | 10/1987 | Resnick et al. | 324/73 |
| 4,718,004 | 1/1988 | Dalal | 364/200 |
| 4,742,515 | 5/1988 | Dabholkar et al. | 370/1.12 |
| 4,747,060 | 5/1988 | Sears, III et al. | 364/481 |
| 4,763,066 | 8/1988 | Yeung et al. | 370/112 |
| 4,792,786 | 12/1988 | Lewis et al. | 364/481 |
| 4,792,932 | 12/1988 | Bowhers et al. | 341/133 |
| 4,875,210 | 10/1989 | Russo et al. | 371/27 |
| 4,901,275 | 2/1990 | Hardie et al. | 364/900 |
| 4,928,246 | 5/1990 | Crawley et al. | 364/514 |
| 5,003,310 | 3/1991 | Thornton | 341/141 |
| 5,029,120 | 7/1991 | Brodeur et al. | 364/718 |
| 5,051,996 | 9/1991 | Bergeson et al. | 371/22.4 |
| 5,062,101 | 10/1991 | Dejewski | 359/135 |

OTHER PUBLICATIONS

Gosh, John, "IC Merges with 32-Kbyte Flash Eprom With 16-Bit Micro", Electronic Design, May 14, 1992, pp. 99-102.

Primary Examiner—Kenneth A. Wieder
Assistant Examiner—Barry C. Bowser
Attorney, Agent, or Firm—Burns, Doane, Swecker & Mathis

[57] ABSTRACT

An analog built-in-test system has a processor for controlling two identical cells, each of which has its own control means for autonomous operation. Each cell may simultaneously receive and generate analog signals from/to external nodes to be tested/stimulated. For these functions, each cell contains analog to digital (A/D) and digital to analog (D/A) converters, timers which control the sampling/conversion rate of the A/D and D/A converters, and A/D and D/A memory means, each for storing the digitized samples. Each cell further has an additional timer for measuring time periods between programmable triggers. Besides being coupled to the processor, each cell is coupled to the other by means of a cell-to-cell bus which conveys data and control signals from one cell to the other. The architecture including the cell-to-cell bus permits the two cells to coordinate with one another to perform measurements such as the phase difference between two analog signals. This architecture also provides the ability to generate a known signal in one cell which can be received by the second cell in order to perform a diagnostic check of the system.

26 Claims, 18 Drawing Sheets

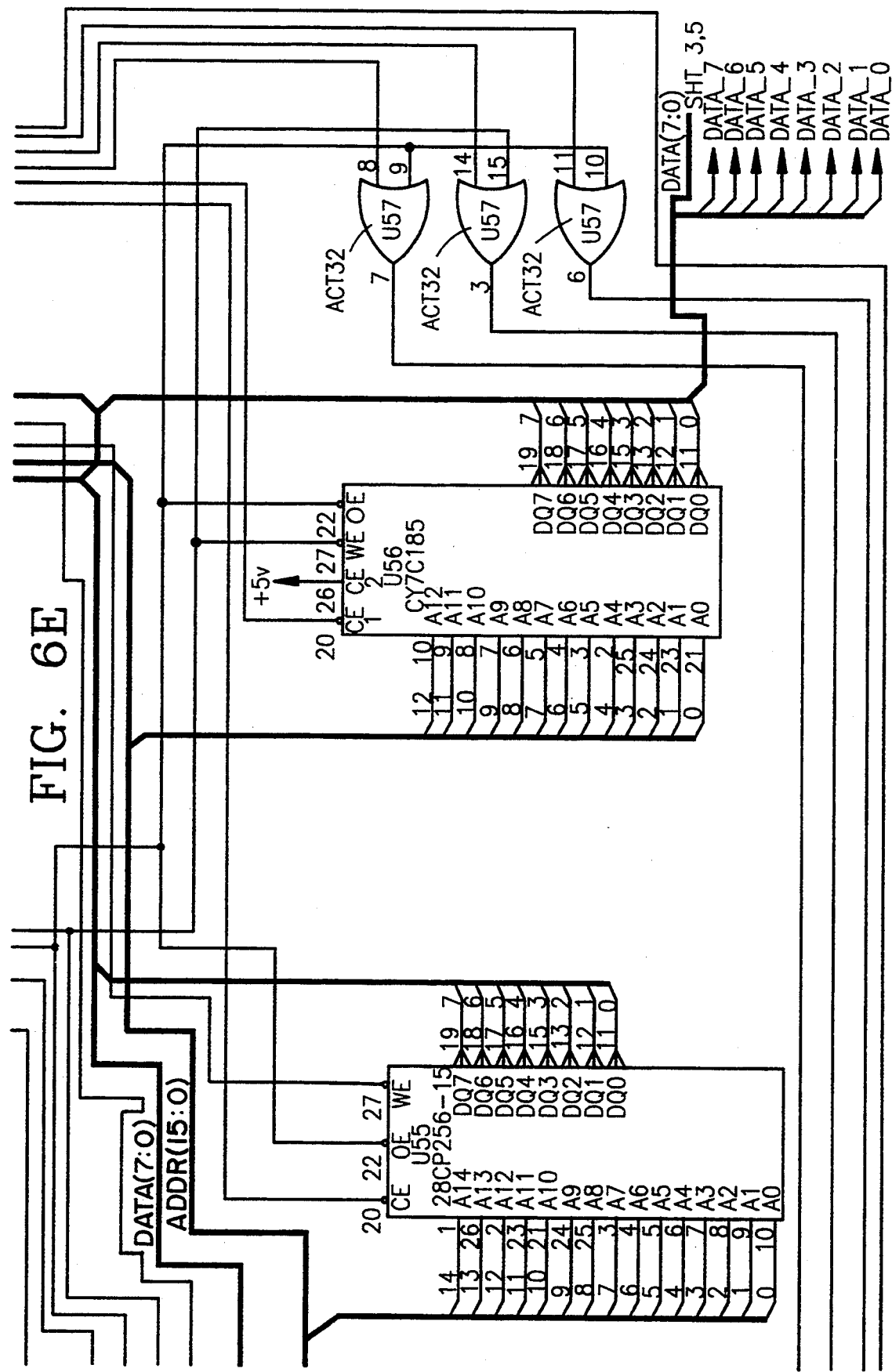

DIAGNOSTIC APPARATUS FOR TESTING AN ANALOG CIRCUIT

BACKGROUND OF THE INVENTION

1. Field of the Invention

This invention relates to built-in test equipment for analog circuits that provides Automatic Test Equipment capability, and more particularly to a circuit on an integrated circuit that provides the capability of detecting and isolating faults of an analog circuit, and also provides enhanced diagnostic capability, such as stimulating an analog circuit, measuring its response, or both simultaneously.

2. Description of Related Art

It is known in the art to use Built-In Test (BIT) technology to monitor status and detect failures of circuits. BIT technology has not provided the capability to perform enhanced diagnostics, however, because this would require large amounts of diagnostic hardware and software, or the use of external equipment. Both of these options are not practical for Space Based weapon systems. Therefore, there is the need for a simple solution that responds to the integrated diagnostics issues in MIL-STD-1814. Paragraph 1.4.1 of that standard states that an integral part of a weapon system's ability to accomplish its mission will be determined by the diagnostics providing information upon which to base decisions.

SUMMARY OF THE INVENTION

In accordance with the present invention, an architecture for performing enhanced diagnostics on an analog circuit is presented that is suitable for implementation on a Very Large Scale Integrated (VLSI) circuit. The architecture comprises a processor coupled to two cells. Each cell comprises a first bus coupled to the processor, a second bus coupled to the other cell, input/output means for coupling to at least one external analog signal node, and cell control means. Each of the cell control means accepts command signals from the processor to measure or stimulate an attached analog signal node. The cell control means then performs the requested measurement or signal stimulation, and then updates a status word upon completion. The processor may poll the status word to determine whether the cell has completed the requested command. Each cell may stimulate one signal and measure one signal simultaneously.

Each cell may further include an analog to digital (A/D) converter coupled to receive analog signals from the input/output means, and to transmit corresponding digital signals alternatively to the first bus or the second bus, and a digital to analog (D/A) converter coupled to receive digital signals alternatively from the first bus or the second bus, and to transmit corresponding analog signals to the input/output means.

Each cell may further include an analog comparator coupled to receive a first analog signal from the input/output means, and a second analog signal from the D/A converter. The analog comparator produces a comparison signal that is coupled to the processor via the first bus.

Each cell may further include at least one timer having an output coupled alternatively to the first or the second bus, and being responsive to timer control signals alternatively sent from the comparator or the cell control means. The timers located in each of the cells may be used to measure the phase difference between two analog signals received, respectively, by the first and second cells. The timers may further be coupled to the A/D converter for controlling the sampling rate thereof, and to the D/A converter for controlling the conversion rate thereof.

Each cell may further include an input memory means having an input coupled to the A/D converter output, and an output coupled to the first bus; and an output memory means having an input coupled to the first bus, and an output coupled to the input of the D/A converter.

The processor may be further coupled to a parallel port and/or a serial port for receiving commands to make a measurement, stimulate a signal, perform internal self-test, monitor all attached signals for pass/fail, and perform built-in test on the attached signals. The processor may return a status, a value, or a string of values over the parallel or serial port, depending on what the received command was.

BRIEF DESCRIPTION OF THE DRAWINGS

FIGS. 6A-6M show the detailed logic for one embodiment of the present invention.

DESCRIPTION OF THE PREFERRED EMBODIMENT

Figure 1:
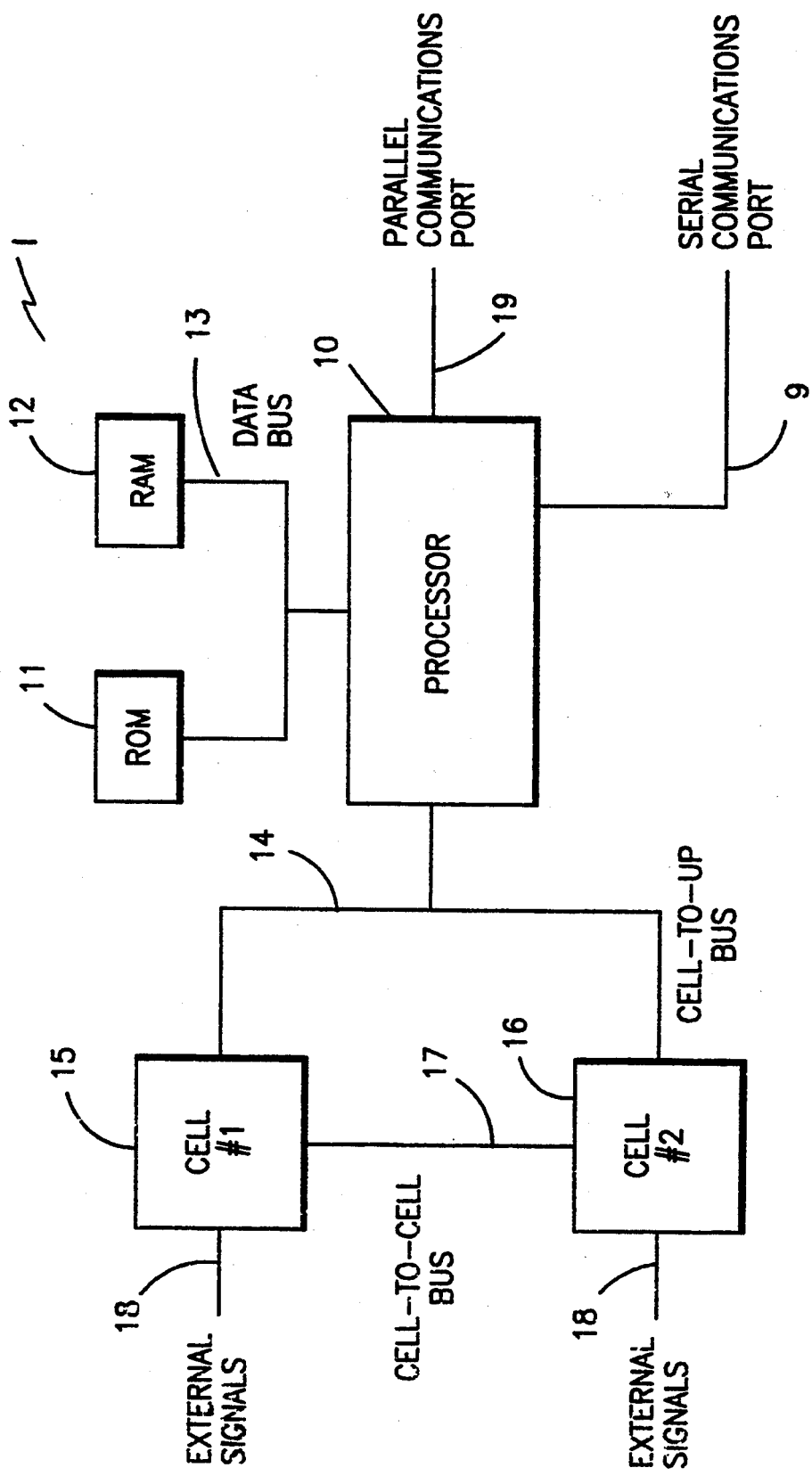
FIG. 1 is a block diagram of the architecture of the analog built-in-test system.

The overall architecture of the analog built-in-test system is shown in FIG. 1. The simplicity of the architecture allows it to be implemented as a single Very Large Scale Integrated (VLSI) circuit which can be made a permanent part of the equipment in which the circuit to be tested resides. The architecture also provides flexibility to perform various complex tests, which are described below.

The logic design for a specific embodiment of the invention is shown in FIGS. 6A through 6M. However, the features of the architecture are best described with reference to the block diagrams shown in FIGS. 1 and 2, and the flowcharts of FIGS. 3 through 5.

Referring now to FIG. 1, the system 1 is controlled by a processor 10. In the preferred embodiment, this is an 8088 microprocessor. The 8088 microprocessor has the advantages of having a small die for implementation on a VLSI chip, an abundance of software support, and upgrade capability. It also has the advantage of having a low power upgrade version.

The software for controlling the processor 10 is stored in a read only memory (ROM) 11, which is connected to the processor 10 by data bus 13. Also connected to the data bus 13 is a random access memory (RAM) 12 which provides the capability for the processor 10 to store as well as retrieve data during processing.

The processor 10 is connected to a parallel communications port 19, and a serial communications port 9.

Both of these ports allow the processor 10 to send information to, and receive information from, another processor such as a main system processor or a data logger (not shown). The serial communications port 9 is preferably an IEEE 1149.1 serial port, which is particularly advantageous in a test environment. The presence of parallel communications port 19 and the serial communications port 9 allows the system 1 to have the dual capability of operating either in an initiated built-in-test (I-BIT) mode, or in a periodic built-in-test (P-BIT) mode. In I-BIT mode, the system performs a particular test or signal measurement in response to a command that is received either from the parallel communications port 19 or from the serial communications port 9. In P-BIT mode, the processor 10 is itself responsible for periodically initiating a particular test or signal measurement.

The system 1 also includes a pair of cells 15, 16 which are connected to the processor 10 by processor-cell bus 14. The processor-cell bus 14 contains address, data, and control lines, so that the processor 10 can access each cell 15, 16 individually in order to control it, and to send or receive data to or from the cell 15, 16. Each cell has input/output (I/O) means 18 for coupling to at least one external analog signal node. In the preferred embodiment, each cell 15, 16 may be connected to as many as fifteen different external analog signals.

Also shown in FIG. 1 is a cell-to-cell bus 17, which connects the first cell 15 to the second cell 16. The cell-to-cell bus 17 carries analog data as well as control signals from one cell to another, and enables the system I to measure the phase difference between two external analog signals, and also to test the operability of the cells. These features are described in further detail below.

Each of the cells 15, 16 has the same internal architecture. This cell architecture will now be described with reference to FIG. 2. Each cell 15, 16 is controlled by a control means 20 which is responsive to control signals received on the processor-cell bus 14. In the preferred embodiment, the control means 20 is implemented as programmable logic, such as a Programmable Logic Device (PLD), which produces the control signals that cause the elements of each cell to operate as described in the following discussion. However, other embodiments of the control means 20 are possible, and it will be recognized by those skilled in the art that the scope of the present invention is not limited to any particular implementation of control logic. Control logic of the type needed to implement the described functions is well known in the art, and need not be described here in greater detail.

For receiving an analog signal from an analog signal node which is external to the system 1, the I/O means 18 is coupled to the inputs of a multiplexor 21. The multiplexor 21 preferably can be connected to as many as fifteen different external analog signals via the I/O means 18, and is controlled by the processor 10, acting through the control means 20, to select one of these signals to appear at its output. The output of the multiplexor 21 is connected to an analog to digital (A/D) converter 22 which preferably produces a series of twelve-bit digital values corresponding to the sampled analog signal, although the width of the digital values can be selected to suit the accuracy required by a particular application. The sampling rate of the A/D converter 22 is variable, and is controlled by the A/D timer 25. The connection between the A/D converter 22 and the A/D timer 25 is for control of the A/D converter 22. That is, the A/D timer 25 delivers clock pulses to the A/D converter 22 which cause the A/D converter to clock in a new analog input and produce a digital equivalent at its output.

The A/D timer 25 is, in turn, controlled by the control means 20. The output of the A/D converter 22 is coupled to the input of a memory means. In the preferred embodiment, this is a first-in-first-out memory device (FIFO), referred to here as A/D FIFO 23, which can store up to 1024 of the twelve-bit digital values. As an alternative, the memory means could also be a dual-port memory.

In an analog signal receive operation, the processor 10, acting through the control means 20, sets the mode and count values in the A/D timer 25 so that the A/D timer 25 will clock the A/D converter 22 at the desired sample rate. Additionally, the processor 10 sets up the multiplexor 21 to select the channel upon which the analog signal will be received. The processor 10 then gives a command to the control means 20, instructing it to begin receiving dam. The processor 10 may attend to other tasks while the A/D converter 22, under the control of the A/D timer 25 and the control means 20, samples the signal at the output of the multiplexor 21, and stores the digitized samples into the A/D FIFO 23. The processor 10 may read the cell's status word, which will indicate whether the A/D FIFO 23 is empty or full or neither. When the processor 10 detects that values are stored in the A/D FIFO 23, it may access them via the processor-cell bus 14 and the control means 20. The processor 10 may also command the cell 15, 16 to stop executing the receive operation.

Once the processor 10 retrieves the sampled data, it may use the sampled values to test and/or measure the incoming signal. Measurement may include, for example, performing a Fourier transform on the incoming signal.

For generating an analog signal on an analog signal node which is external to the system 1, the processor 10 places digital values representing the analog signal into a second memory means. In the preferred embodiment, this is the D/A FIFO 28, which is capable of storing up to 1024 12-bit values. As an alternative, the second memory means could also be a dual-port RAM. This data transfer takes place via the processor-cell bus 14 and the control means 20. The output of the D/A FIFO 28 is coupled to the input of a digital to analog (D/A) converter 27. The rate at which the D/A converter 27 converts the digital samples presented at its input into an analog signal is variable, and is under the control of the D/A timer 30. The D/A timer 30 is, in turn, controlled by the control means 20. The output of the D/A converter 27 is coupled to the input of a demultiplexor 26, so that the generated signal may be sent to a particular one of a plurality of possible analog signal nodes. The output of the demultiplexor 26 is connected to the I/O means 18. In the preferred embodiment, the demultiplexor 26 has fifteen outputs which may be tied to individual analog signal nodes. The selection of a particular analog signal node by the demultiplexor 26 is controlled by the processor 10, acting through the control means 20.

In an analog signal send operation, the processor 10, acting through the control means 20, stores sample values, corresponding to a signal to be generated, into the D/A FIFO 28. Then, the processor 10 sets the mode and count values in the D/A timer 30 so that the D/A timer 30 will clock the D/A converter 27 to retrieve values from the D/A FIFO 28 and convert them to voltage levels at the desired conversion rate. Additionally, the processor 10 sets up the demultiplexor 26 to select the channel upon which the analog signal is to be sent. The processor 10 then gives a command to the control means 20, instructing it to begin sending the generated signal. The processor 10 may attend to other tasks while the D/A converter 27, under the control of the D/A timer 30 and the control means 20, reads a sample value from the D/A FIFO 28, converts the sample to a voltage level, and outputs this signal to the desired channel through the demultiplexor 26. When all of the sample values have been output, the D/A converter 27 will start again from the top of the list of sample values in the D/A FIFO 28, thus allowing the cell 15, 16 to autonomously generate periodic waveforms. The processor 10 may read the cell's status word, which will indicate whether the D/A FIFO 28 is empty or full or neither. The processor 10 may direct the cell control means 20 to stop sending the signal accordingly. Another use of the status word is during self-test of the system 1, in order to check whether the D/A FIFO 28 is functioning properly.

It can be seen from the above-described cell configuration that each cell is capable of receiving an analog signal from a first analog signal node, while simultaneously generating an analog signal on a second analog signal node. The only restriction is that the first and the second analog signal nodes cannot be the same node. One application to which the simultaneous receive/generate capability can be put is in the stimulation of an external component with a known signal in order to measure its response. For example, the gain of an amplifier stage may be measured by producing a known signal at an output of the demultiplexor 26, which is connected to the input of the amplifier stage. The output of the amplifier stage can be connected to one input of multiplexor 2 1. By using an analog signal receive operation, the amplifier's output signal can be compared with the magnitude of the known input signal, and the gain computed.

Another application of the simultaneous receive/generate function could be for diagnostic purposes. As long as it is known that a particular channel is unused, the processor 10 could direct a single cell 15, 16 to generate and receive a signal on a single cell. By comparing the received signal with the known generated signal, malfunctions within the cell 15, 16 can be detected. This form of test can also be carried out by using both cells 15, 16 simultaneously. Here, one cell, for example the first cell 15, can be configured to generate a known signal. The other cell, in this example the second cell 16, can be configured to receive the signal generated by the first cell 15. The cell-to-cell bus 17 connection allows this. If the signal received by the second cell 16 does not match the one generated by the first cell 15, then the processor can determine that a malfunction is occurring somewhere in the system. With further diagnostics, described later, the location of the malfunction can be narrowed down.

In addition to the above-described elements, each cell architecture preferably also includes a comparator 24, which compares two analog signals, and produces a signal which is asserted when a first input signal is greater than a second input signal. In the preferred embodiment, a first input of the comparator 24 is coupled to the output of the multiplexor 21. A second input of the comparator 24 is coupled to the output of the D/A converter 27. The output of the comparator 24 is coupled to the control means 20, and to the comparator timer 29. The comparator timer 29 is also coupled to the control means 20. This configuration allows the system 1 to measure the frequency of an analog signal received by multiplexor 21. This configuration also allows the system 1 to measure the phase difference between a first analog signal received by the first cell 15, and a second analog signal received by the second cell 16. The operation of the system hardware for performing these and other functions is further described below.

Figure 2:
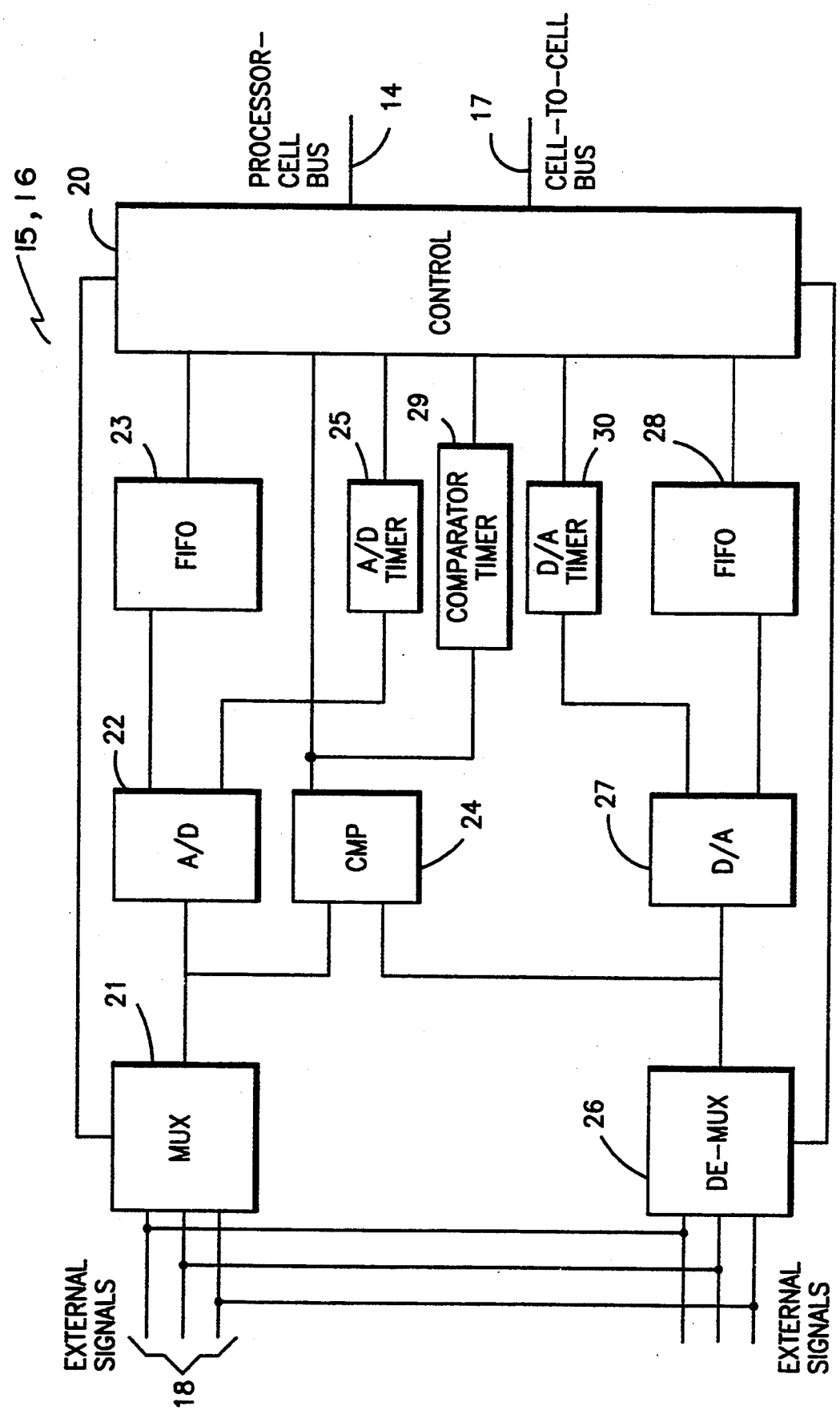
FIG. 2 is a block diagram showing the architecture of one of the cells that are part of the built-in-test system.

The timers contained in each cell 15, 16 will now be described in more detail. As shown in FIG. 2, each cell 15, 16 contains three timers, identified as the A/D timer 25, the comparator timer 29, and the D/A timer 30. In the preferred embodiment, these three timers are implemented as a commercially available 82C54 timer chip, manufactured by Intel Corporation of Santa Clara, Calif. These timers may be programmed by the processor 10, acting through the cell's control means 20, to store initial count values, and also to operate in selected modes. These modes determine whether a particular timer will count up or count down. These modes also determine the polarity of the output of the timers so, for example, the timers can act as appropriate triggers to the A/D and D/A converters 22 and 27.

One of the selected modes can cause the timer to produce an interrupt signal based on a terminal count. This mode is used for event counting. The counter counts down every time the event occurs. The output remains low until the counter equals zero. Then the output goes high and remains high.

Another selected mode can cause a timer to act as a hardware retriggerable one-shot, in which the output goes low on a pulse acting as a trigger, and stays low until a specified count is exhausted.

In another mode of operation, a timer can be used as a rate generator, in which it functions as a divide by N counter (N being an integer). In this mode, the output is initially high, and then goes low for 1 clock when the count is exhausted, at which point the output then goes high again.

Another mode of operation is a square wave mode, which is similar to the rate generator mode. Here, the output is initially high. When half the count is exhausted, the output goes low for the duration of the remainder of the count. Then the output returns to a high value.

In another mode of operation, a timer can function as a software triggered strobe. In this mode, the output is initially high, and goes low for one clock cycle upon the expiration of a count. The output then returns to a high level. In this mode, the counting sequence is triggered by writing the initial count to the tinier. Thus, the timer can act as a "watchdog timer."

In another mode of operation, a timer can function as a hardware triggered strobe. Here, the output is initially high. An input signal acts as a trigger, causing a count value to be loaded into a timer register, after which the tinier begins counting the output of the timer goes low for one pulse when the count expires, and then goes high again.

In another mode, partly controlled by the control means in conjunction with the timer's internal mode, the comparator tinier 29 can be programmed to not act on a trigger, received from a local comparator 24, and instead, to pass it, via the cell-to-cell bus 17, to a timer in another cell 15, 16, where it triggers a corresponding comparator timer 29 located in that cell 15, 16. This feature is extremely useful for measuring the phase difference between two analog signals, as will be explained in more detail below.

The operation of the above-described architecture to perform various measurements and tests will be apparent to one skilled in the art. Nonetheless, the use of the architecture will be illustrated with three examples.

Figure 3:
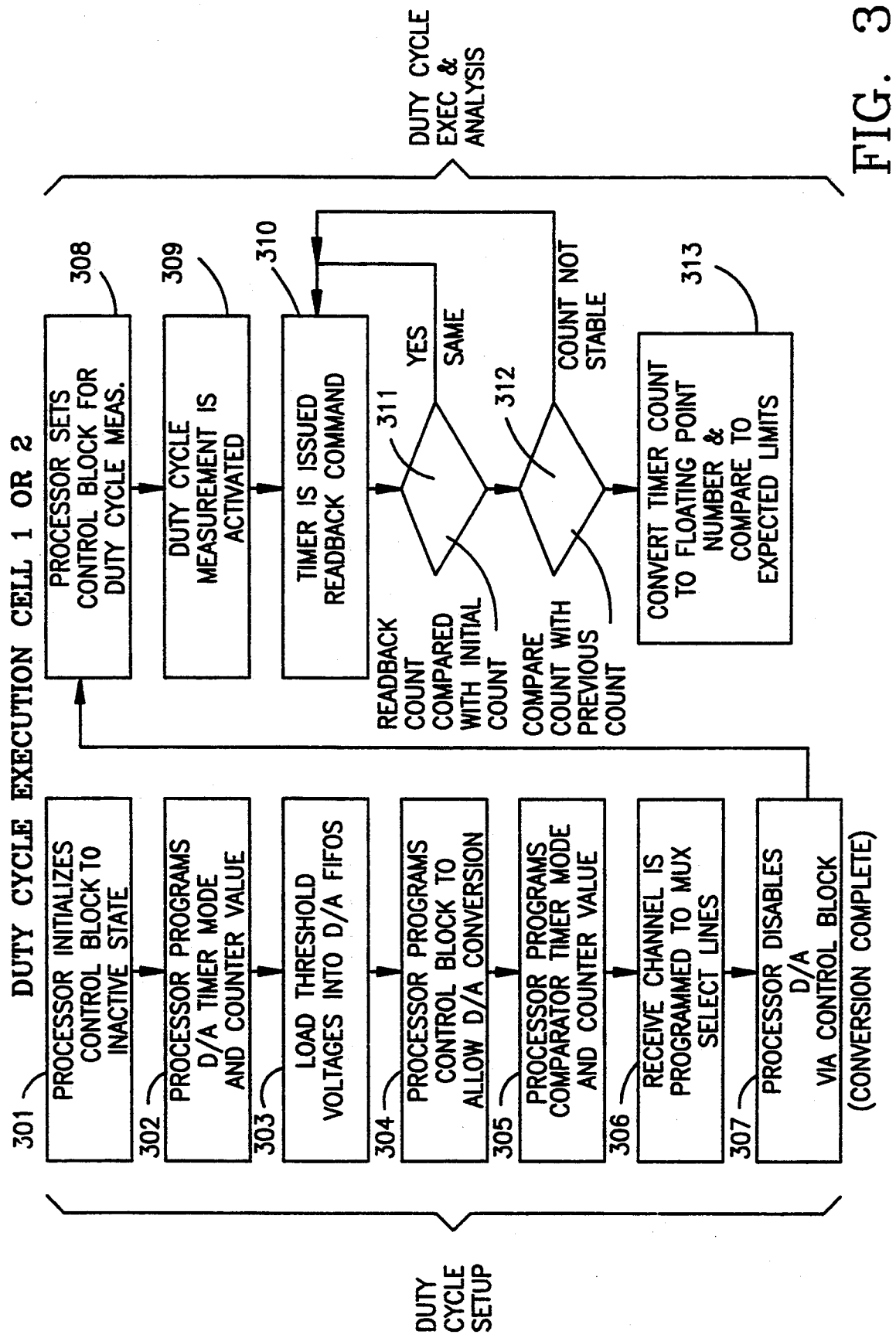
FIG. 3 is a flowchart showing a sequence of steps for measuring the duty cycle of an analog signal.

With reference to FIG. 3, a flowchart is presented which shows the sequence of operations that would be performed in order to measure the duty cycle of an analog signal that is input to either of the two cells 15, 16. The duty cycle of an analog signal is a period of time measured from a rising edge of the signal to the next falling edge of the signal. For the purpose of this description, it will be assumed that the signal to be measured is an input of the first cell 15. However, it should be understood that because the two cells 15, 16 are identical, the following description may equally be applied to the case where the measured signal is an input of the second cell 16.

Blocks 301 through 307 describe the steps that are needed to initialize the first cell 15 to make the duty cycle measurement. In block 301, the processor 10 sends control signals to the first cell's control means 20 in order to cause the first cell 15 to become inactive. This is necessary because several register values and operating modes must be initialized before making the duty cycle measurement. If the first cell 15 were not made inactive, the danger exists that it would perform an action based on only a partial initialization of its resources.

Next, in block 302, the processor 10 initializes the mode and counter value of the cell's D/A timer 30. The term "mode" in this instance refers to the type of operation (e.g., count up, count down, count using an external trigger) as well as to the shape of the waveform that will be produced by the D/A timer 30. In the case of measuring duty cycle, the D/A timer mode and counter values are set such that when the D/A conversion is enabled, the D/A timer 30 will provide the necessary clock signal for the D/A converter 27 to clock in one value from the D/A FIFO 28.

In block 303, the processor 10 loads a digital value, corresponding to a threshold voltage, into the D/A FIFO 28. This is followed, in block 304, by a command from the processor 10 to the control means 20, causing the D/A converter 27 to clock in and convert the digital value, previously loaded in the D/A FIFO 28, into an analog voltage. Because only one value is clocked in by the D/A converter 27, its output holds a constant D.C. voltage. This so-called "threshold voltage" is provided at one input of the comparator 24.

Next, in block 305, the processor 10 initializes the mode and counter value of the cell's comparator timer 29. Again, the term "mode" in this instance refers to the type of operation (e.g., count up, count down, count using an external trigger) as well as to the shape of the waveform that will be produced by the comparator timer 29. In the case of measuring duty cycle, the comparator timer mode and counter values are set such that when the first cell 15 is enabled, the comparator timer 29 will begin counting at a known rate from a known initial value after being triggered by a signal appearing at the output of the comparator 24.

In block 306, the processor 10 causes the multiplexor 21 to select the particular channel upon which the analog signal to be measured appears.

In block 307, the processor 10 causes the D/A converter 27 to stop any further conversion operations. The result of this is that the D/A converter 27 will hold the threshold voltage that was clocked in during the execution of block 304. This threshold voltage is used by the comparator 24 as a reference point against which the analog signal to be measured is compared in order to determine whether the analog signal is rising or falling. This completes the initialization phase of the duty cycle measurement routine.

Execution of the routine then continues at block 308, where the processor 10 sends a duty cycle measurement command to the control means 20. Then, in block 309, the processor 10 puts the first cell 15 in the active state to begin the actual measurement. During the measurement phase of operation, the analog signal present on the selected channel appears at the output of the multiplexor 21. This signal is also present at one input of the comparator 24. As previously stated, the other input of the comparator is coupled to the D.C. threshold voltage coming out of the D/A converter 27. Thus, the comparator will produce a signal that indicates when the analog signal to be measured becomes greater than the threshold voltage, and also when the analog signal to be measured becomes lower than the threshold voltage. The comparator timer 29 has been set up, during the initialization phase, to begin counting at a known rate when the output of the comparator 24 indicates that the analog signal first becomes greater than the threshold voltage. Counting continues until the output of the comparator 24 indicates that the analog signal has fallen below the level of the threshold voltage, at which point the comparator timer 29 stops its counting operation.

The program loop comprising blocks 310, 311, and 312 can now be understood. In block 310, the processor 10 executes a "readback" command to get the current counter value contained in the comparator timer 29. In block 311, the returned counter value is compared with the known initial value in order to detect whether or not counting has begun. If the two values are equal, then counting has not yet begun, and processor execution loops back to block 310. If the two values are not equal, then counting has started, indicating that the analog signal has become greater than the threshold voltage value. Processor execution then continues at block 312 to determine whether the counting operation has stopped. This is determined by comparing the present count with the value that was read during the immediately preceding pass through this same loop. If the two values are different, then counting is still going on, and the processor execution must jump back to block 310 to repeat the loop once again. If, however, the two values are the same, then the comparator timer 29 has stopped counting, indicating that the analog signal has returned to a value less than the threshold value. Execution then proceeds to block 313, where the timer count is converted to a duty cycle measurement by multiplying it by the known time interval between successive counts. The processor may either store this value within the RAM 12 for local use, or it may up-load it to another processor (not shown) by means of the parallel communications port 19 or the serial port 9.

Also shown in block 3 13 is an operation in which the measured duty cycle is compared to upper and lower expected limits. This is useful for diagnosing problems within the analog built-in-test system. For example, if the measured duty cycle is too high or too low, the processor 10 will store this information in connection with all of the components that were involved in the measurement. In the case illustrated above, these would be the multiplexor 21, the comparator 24, the comparator timer 29, the D/A timer 30, the D/A converter 27, and the D/A FIFO 28, all located in the first cell 15. Then, the next time a self-test operation is performed on the analog built-in-test system 1, a test is selected which causes the second cell to generate an analog signal having a known duty cycle. As described above, signal generation is performed by loading the cell's D/A FIFO 28 with digital sample values, and programming the D/A timer 30 to cause the D/A converter 27 to load and convert successive samples at a known rate. The signal that has been generated by the second cell 16 is then routed to the first cell 15, where it is made available at the output of the multiplexor 21. The first cell 15 is then directed to perform a duty cycle measurement on this known analog signal. If the measurement is within expected limits, the suspect components of the first cell 15 are presumed to be functioning correctly, and the source of the originally detected measurement discrepancy is presumed to be indicative of an error which is external to the analog built-in-test system. If, however, the measured duty cycle of the known analog signal is similarly outside the expected upper and lower limits, then a fault within the first cell 15 is strongly suspected.

Figure 4:
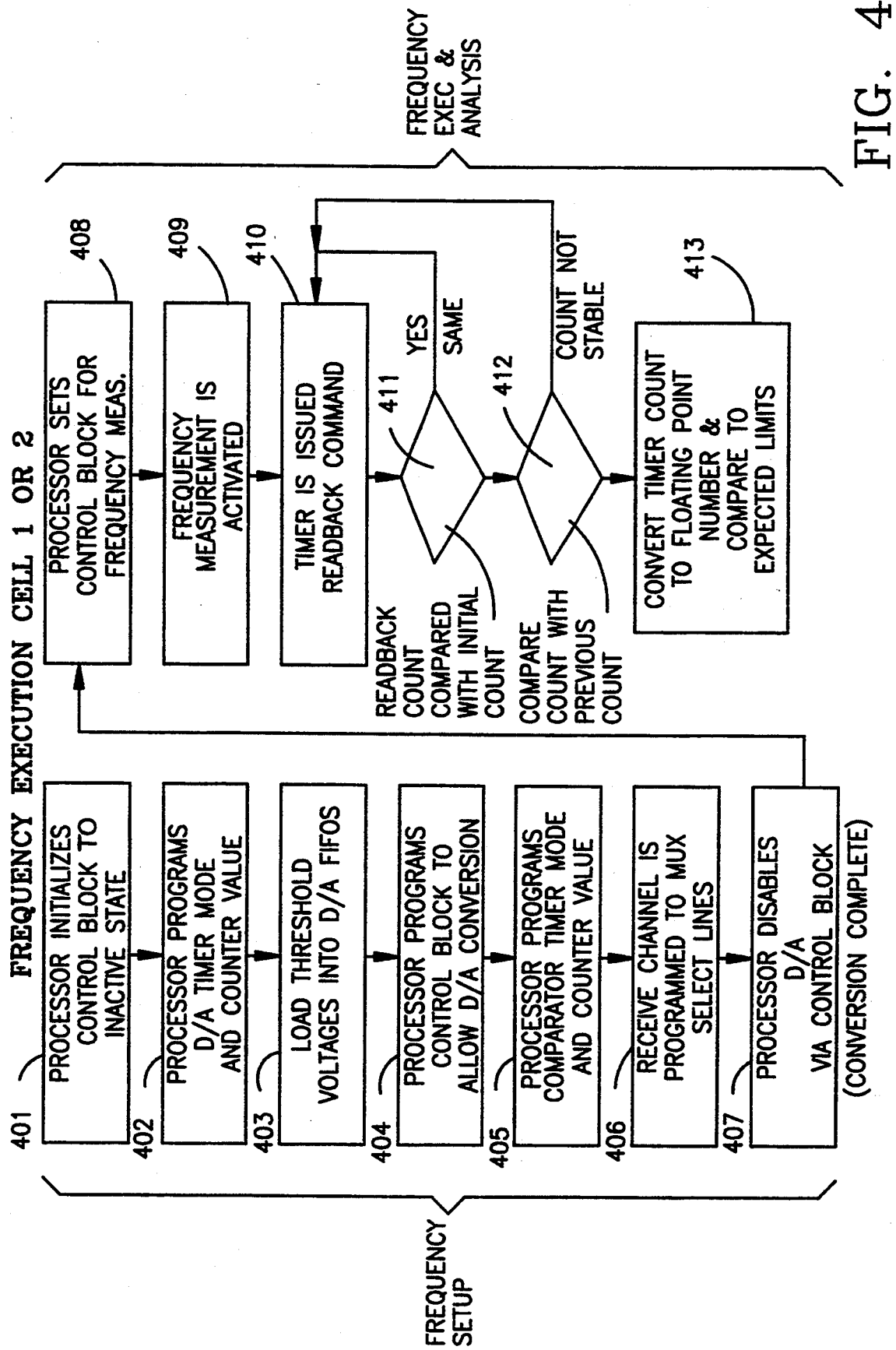
FIG. 4 is a flowchart showing a sequence of steps for measuring the frequency of an analog signal.

Returning now to examples which illustrate the use of the above-described architecture, FIG. 4 shows the sequence of steps that are involved in performing a frequency measurement of an analog signal that may be input to either the first cell 15, or the second cell 16. The frequency of an analog signal can be measured as the inverse of the amount of time between two successive rising edges of the signal. For the purposes of illustration, it will be assumed in the following description that the steps are being carried out within the first cell 15. However, because the two cells 15, 16 are identical, the description is equally applicable to the case where the second cell 16 is doing the measuring.

Measuring the frequency of an analog signal is very similar to measuring that signal's duty cycle. Consequently, it will become apparent that many of the steps described above with respect to the duty cycle measurement are equally applicable here. Referring now to FIG. 4, blocks 401 through 407 describe the steps that are needed to initialize the first cell 15 to make the frequency measurement. In block 401, the processor 10 sends control signals to the first cell's control means 20 in order to cause the first cell 15 to become inactive. This is necessary because several register values and operating modes must be initialized before making the frequency measurement. If the first cell 15 were not made inactive, the danger exists that it would perform an action based on only a partial initialization of its resources.

Next, in block 402, the processor 10 initializes the mode and counter value of the cell's D/A timer 30. In the case of measuring frequency, the D/A timer mode and counter values are set such that when a D/A conversion is enabled, the D/A timer 30 will provide the necessary clock signal for the D/A converter 27 to clock in one value from the D/A FIFO 28.

In block 403, the processor 10 loads a digital value, corresponding to a threshold voltage, into the D/A FIFO 28. This is followed, in block 404, by a command from the processor 10 to the control means 20, causing the D/A converter 27 to clock in and convert the digital value, previously loaded in the D/A FIFO 28, into an analog voltage. Because only one value is clocked in by the D/A converter 27, its output holds a constant D.C. voltage. This so-called "threshold voltage" is provided at one input of the comparator 24.

Next, in block 405, the processor 10 initializes the mode and counter value of the cell's comparator timer 29. Again, the term "mode" in this instance refers to the type of operation (e.g., count up, count down, count using an external trigger) as well as to the shape of the waveform that will be produced by the comparator timer 29. In the case of measuring frequency, the comparator timer mode and counter values are set such that when the first cell 15 is enabled, the comparator timer 29 will begin counting at a known rate from a known initial value after being triggered by a signal appearing at the output of the comparator 24.

In block 406, the processor 10 causes the multiplexor 21 to select the particular channel upon which the analog signal to be measured appears.

In block 407, the processor 10 causes the D/A converter 27 to stop any further conversion operations. The result of this is that the D/A converter 27 will hold the threshold voltage that was clocked in during the execution of block 404. This threshold voltage is used by the comparator 24 as a reference point against which the analog signal to be measured is compared in order to determine whether the analog signal is rising or falling. This completes the initialization phase of the frequency measurement routine.

Execution of the routine then continues at block 408, where the processor 10 sends a frequency measurement command to the control means 20. Then, in block 409, the processor 10 puts the first cell 15 in the active state to begin the actual measurement. During the measurement phase of operation, the analog signal present on the selected channel appears at the output of the multiplexor 21. This signal is also present at one input of the comparator 24. As previously stated, the other input of the comparator is coupled to the D.C. threshold voltage coming out of the D/A converter 27. Thus, the comparator will produce a signal that indicates when the analog signal to be measured becomes greater than the threshold voltage, and also when the analog signal to be measured becomes lower than the threshold voltage. The comparator timer 29 has been set up, during the initialization phase, to begin counting at a known rate when the output of the comparator 24 indicates that the analog signal first becomes greater than the threshold voltage. Counting continues until the output of the comparator 24 indicates first that the analog signal has fallen below the level of the threshold voltage, and then that the analog signal has again become greater than the threshold voltage, at which point the comparator timer 29 stops its counting operation. Thus, the timer count represents the amount of time between two rising edges of the analog signal to be measured.

The program loop comprising blocks 410, 411, and 412 can now be understood. In block 410, the processor 10 executes a "readback" command to get the current counter value contained in the A/D timer 25. In block 411, the returned counter value is compared with the known initial value in order to detect whether or not counting has begun. If the two values are equal, then counting has not yet begun, and processor execution loops back to block 410. If the two values are not equal, then counting has started, indicating that the analog signal has become greater than the threshold voltage value, and that the first rising edge of the analog signal has been identified. Processor execution then continues at block 412 to determine whether the counting operation has stopped. This is determined by comparing the present count with the value that was read during the immediately preceding pass through this same loop. If the two values are different, then counting is still going on, and the processor execution must jump back to block 410 to repeat the loop once again. If, however, the two values are the same, then the comparator timer 29 has stopped counting, indicating that the comparator 24 has detected a second rising edge of the analog signal. Execution then proceeds to block 413, where the timer count is converted to a period measurement by multiplying it by the known time interval between successive counts. The calculated period can then be inverted to obtain the frequency of the analog signal. The processor may either store this value within the RAM 12 for local use, or it may up-load it to another processor (not shown) by means of the parallel communications port 19.

Also shown in block 413 is an operation in which the measured frequency is compared to upper and lower expected limits. As described above with respect to the measured duty cycle, comparing the measured frequency with expected upper and lower values is useful not only for detecting a malfunction that occurs external to the system 1, but also for diagnosing problems within the analog built-in-test system 1.

Figure 5:
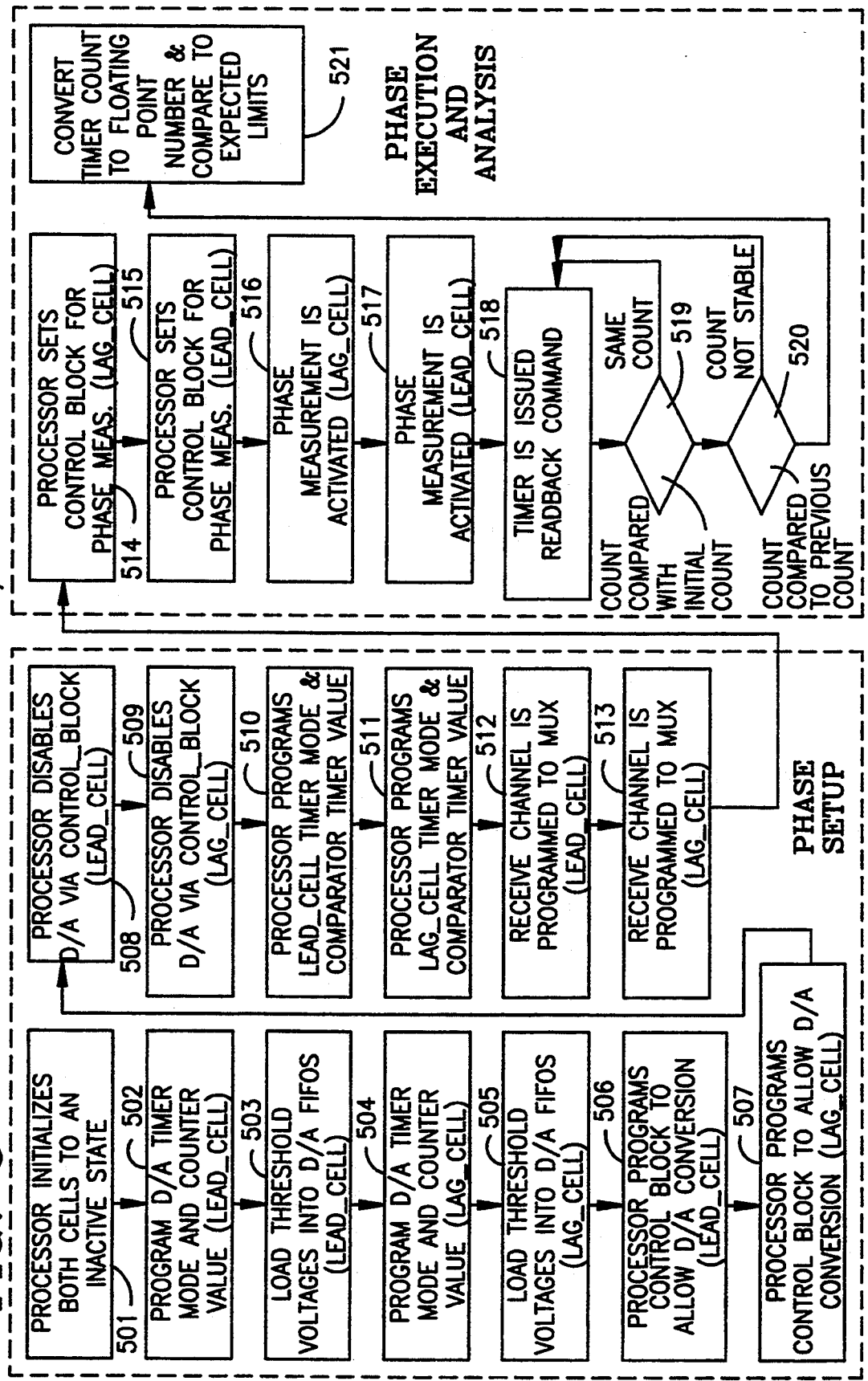
FIG. 5 is a flowchart showing a sequence of steps for measuring the phase difference between two analog signals.
Figure 6A:
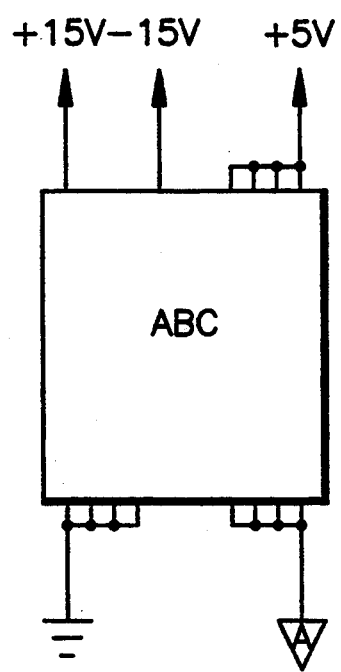
Figure 6B:
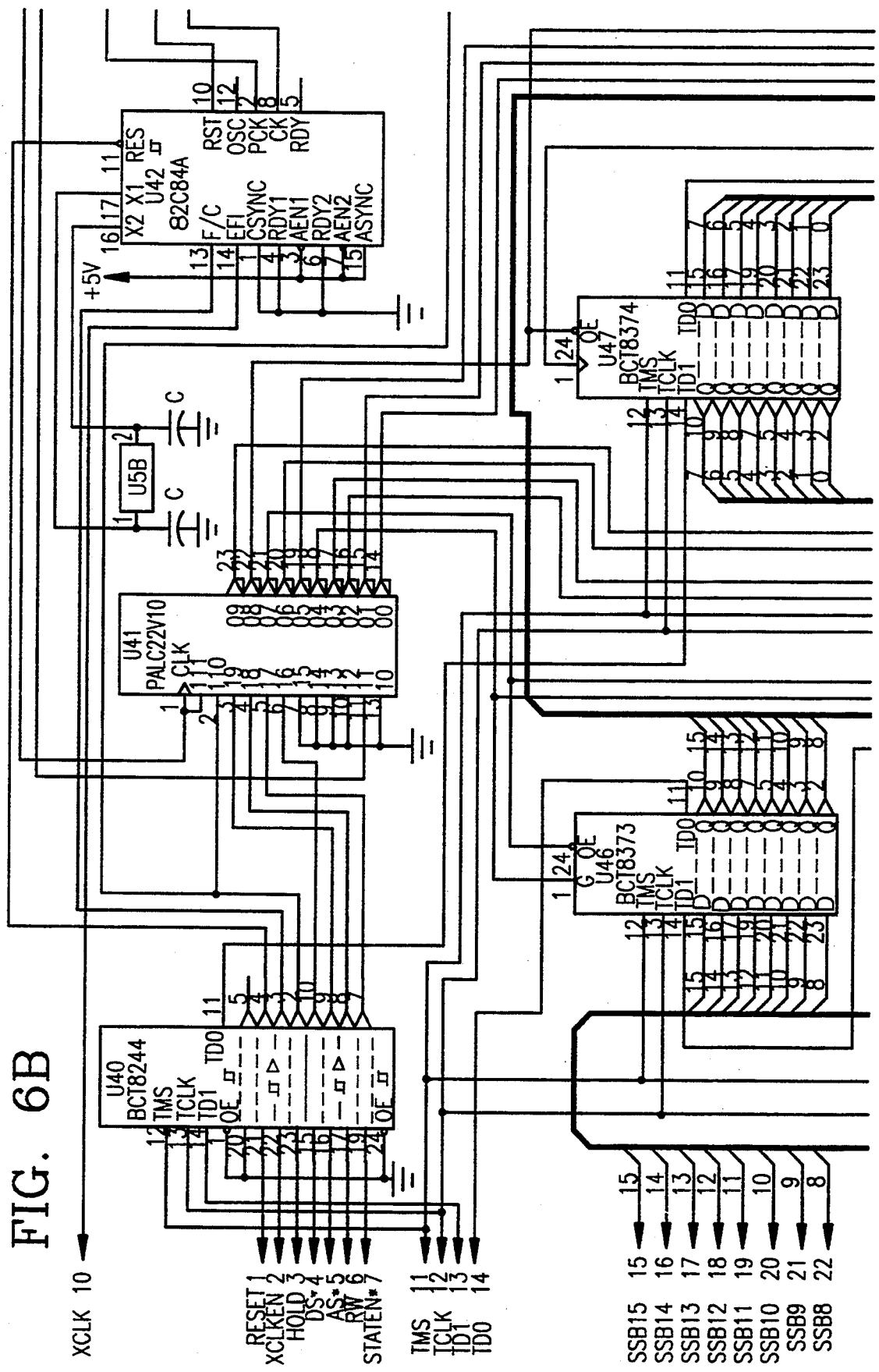
Figure 6C:
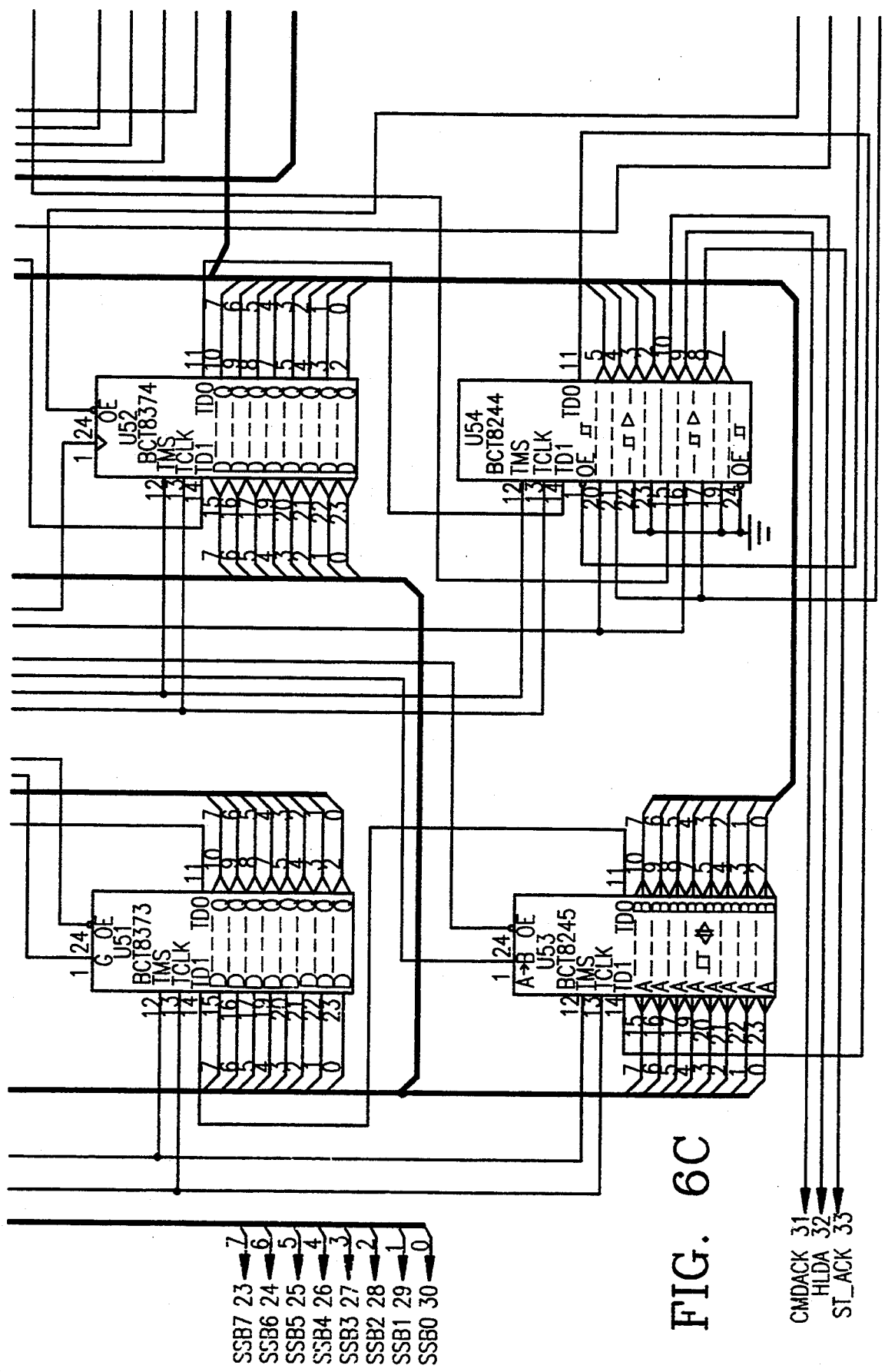
Figure 6D:
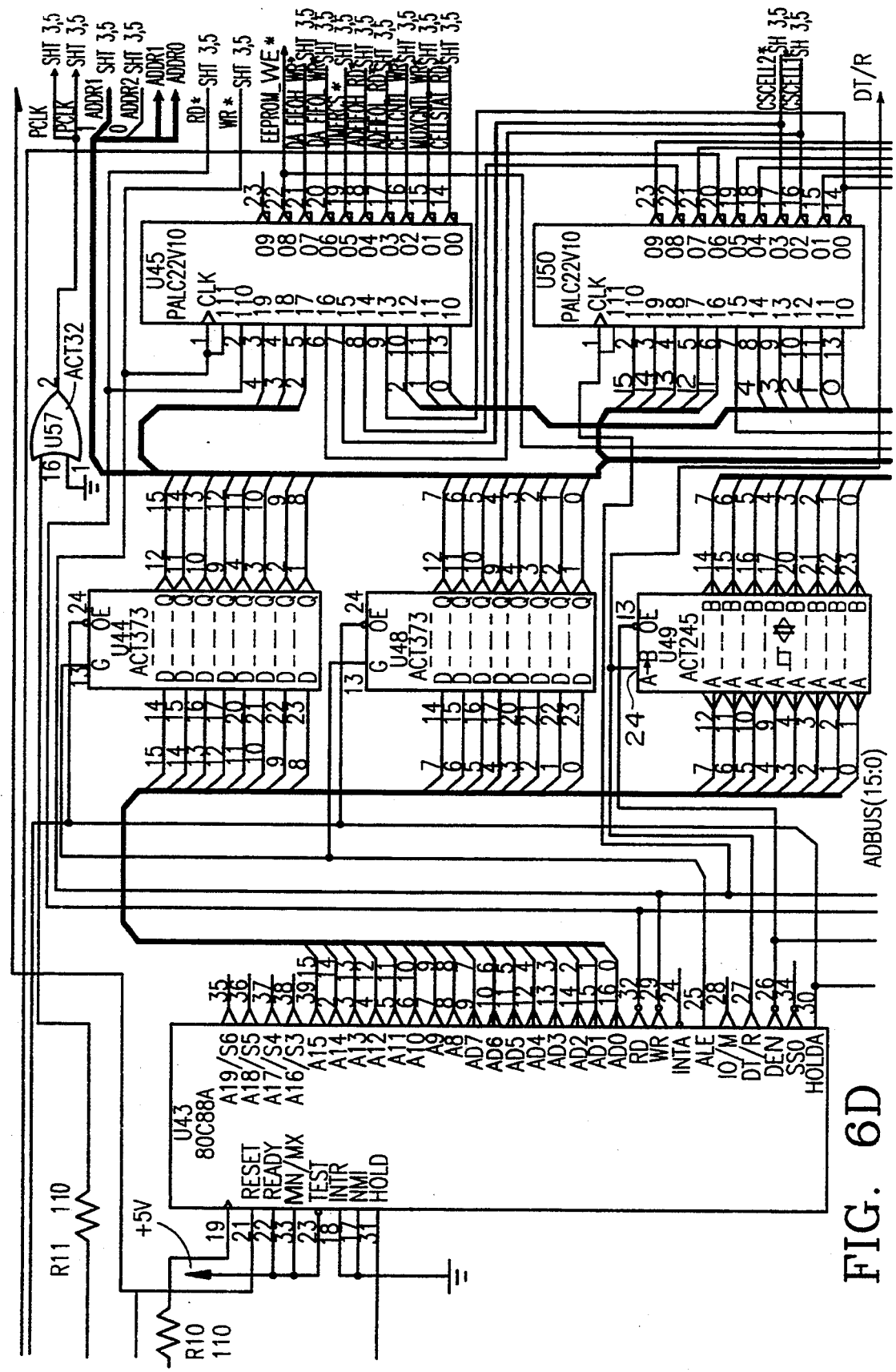
Figure 6F:
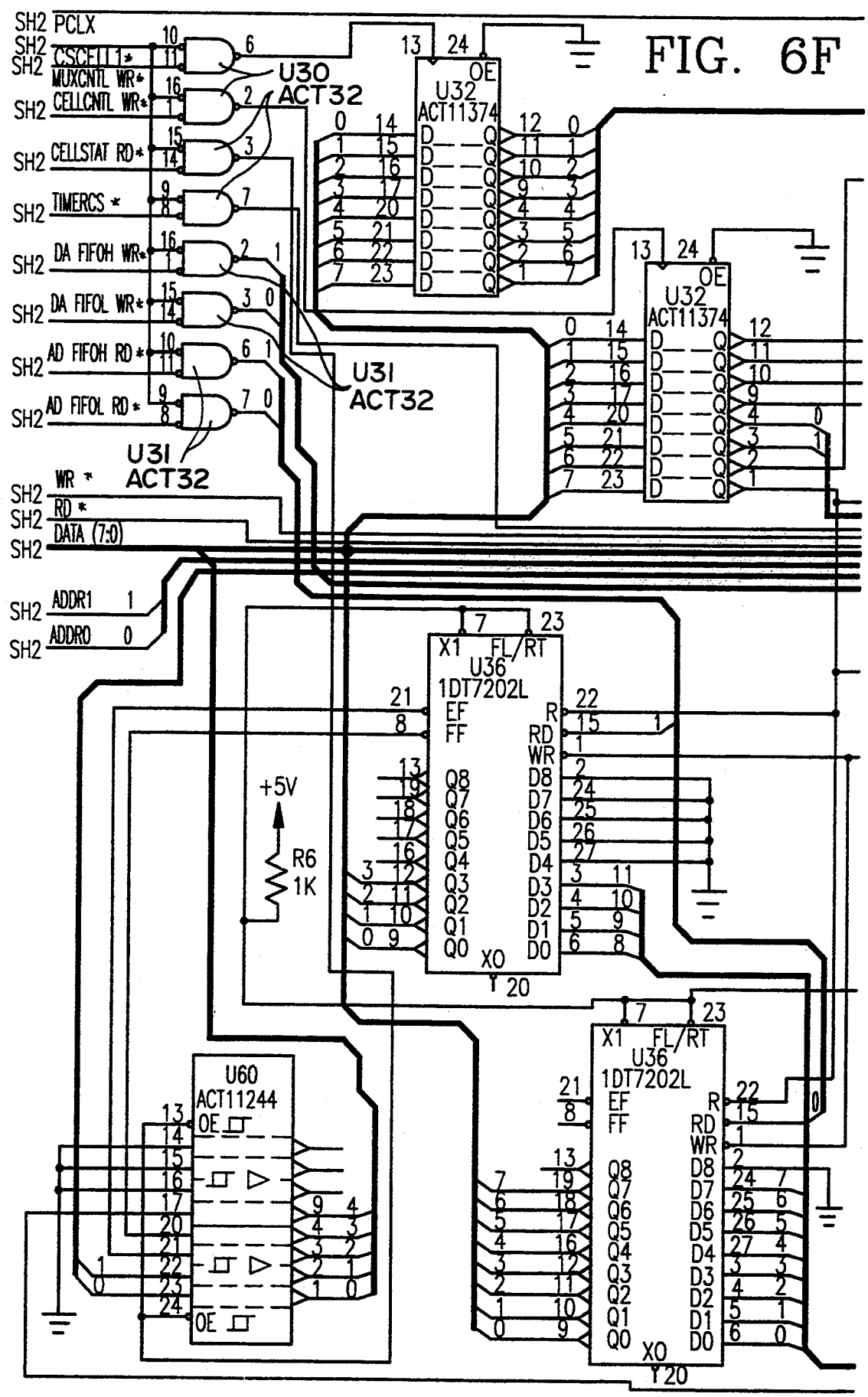
Figure 6G:
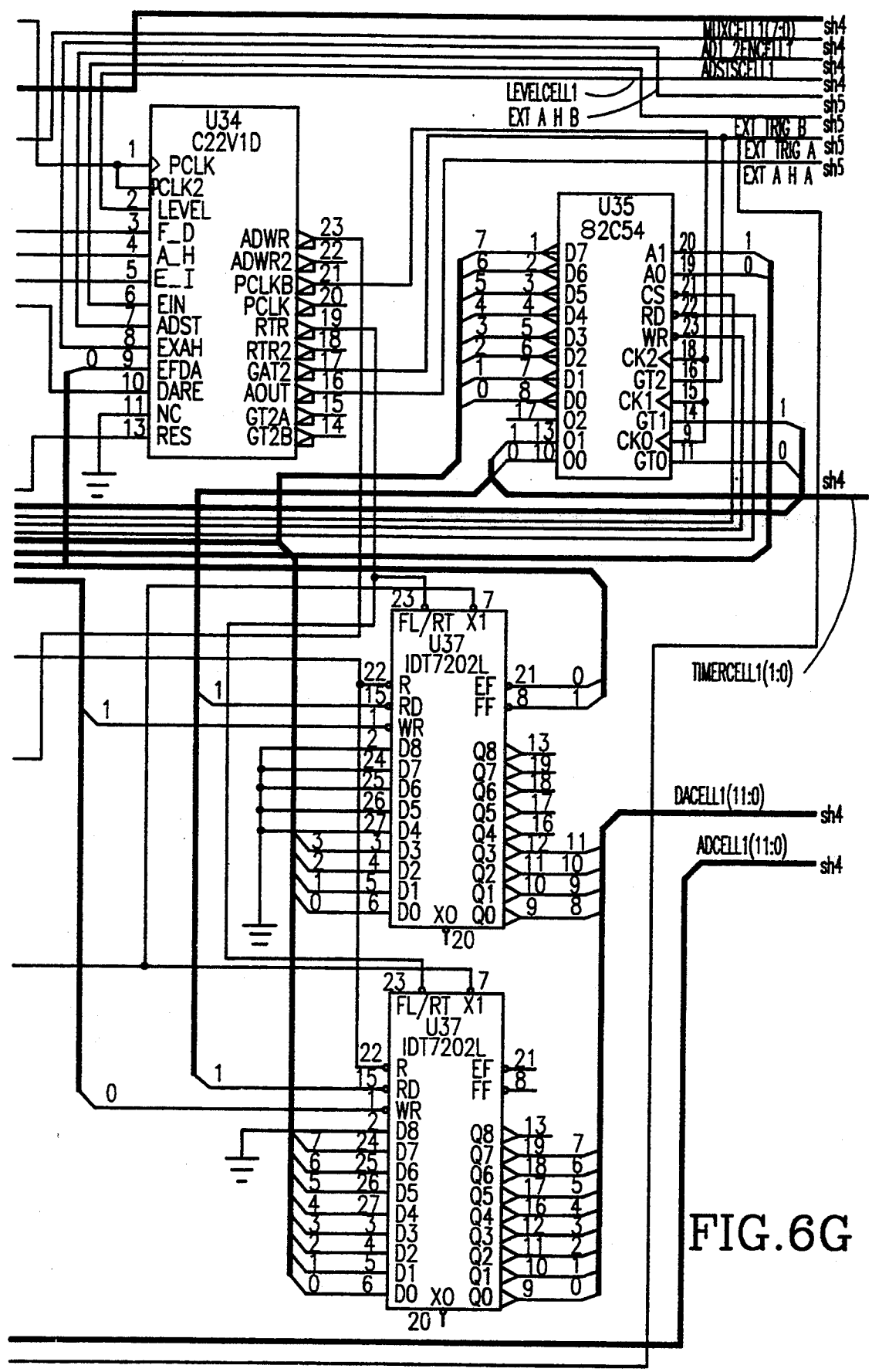
Figure 6H:
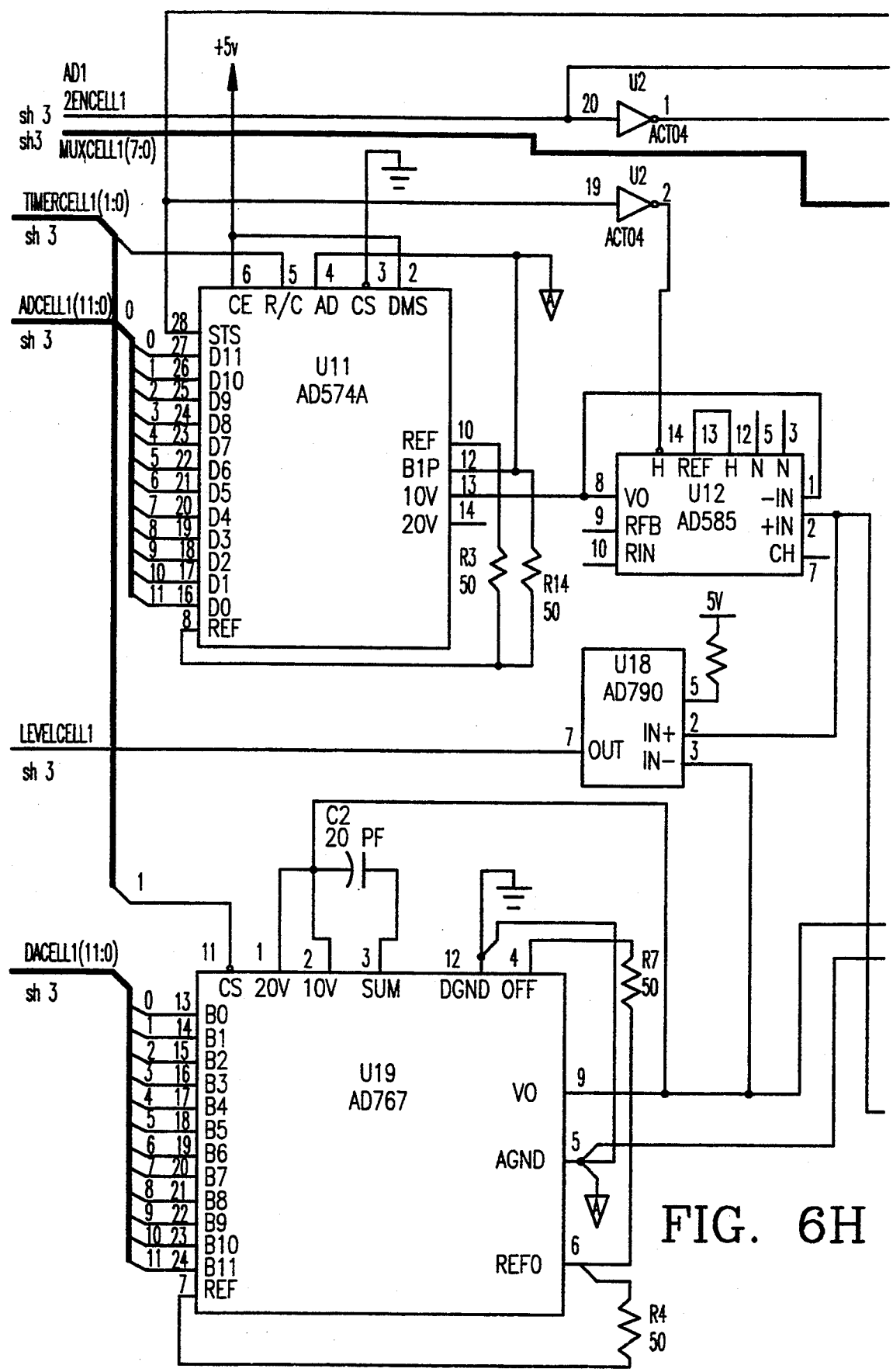
Figure 6I:
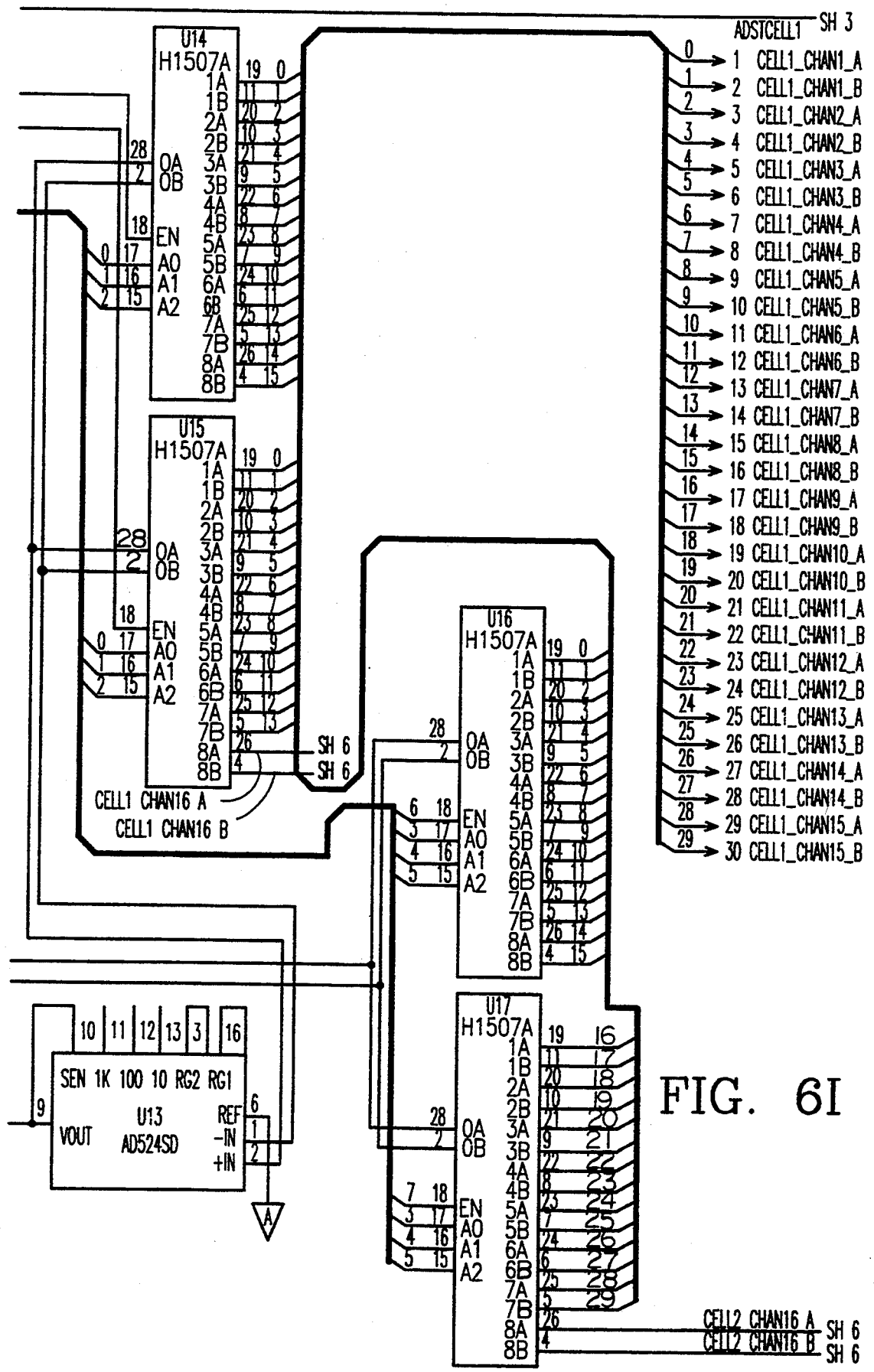
Figure 6J:
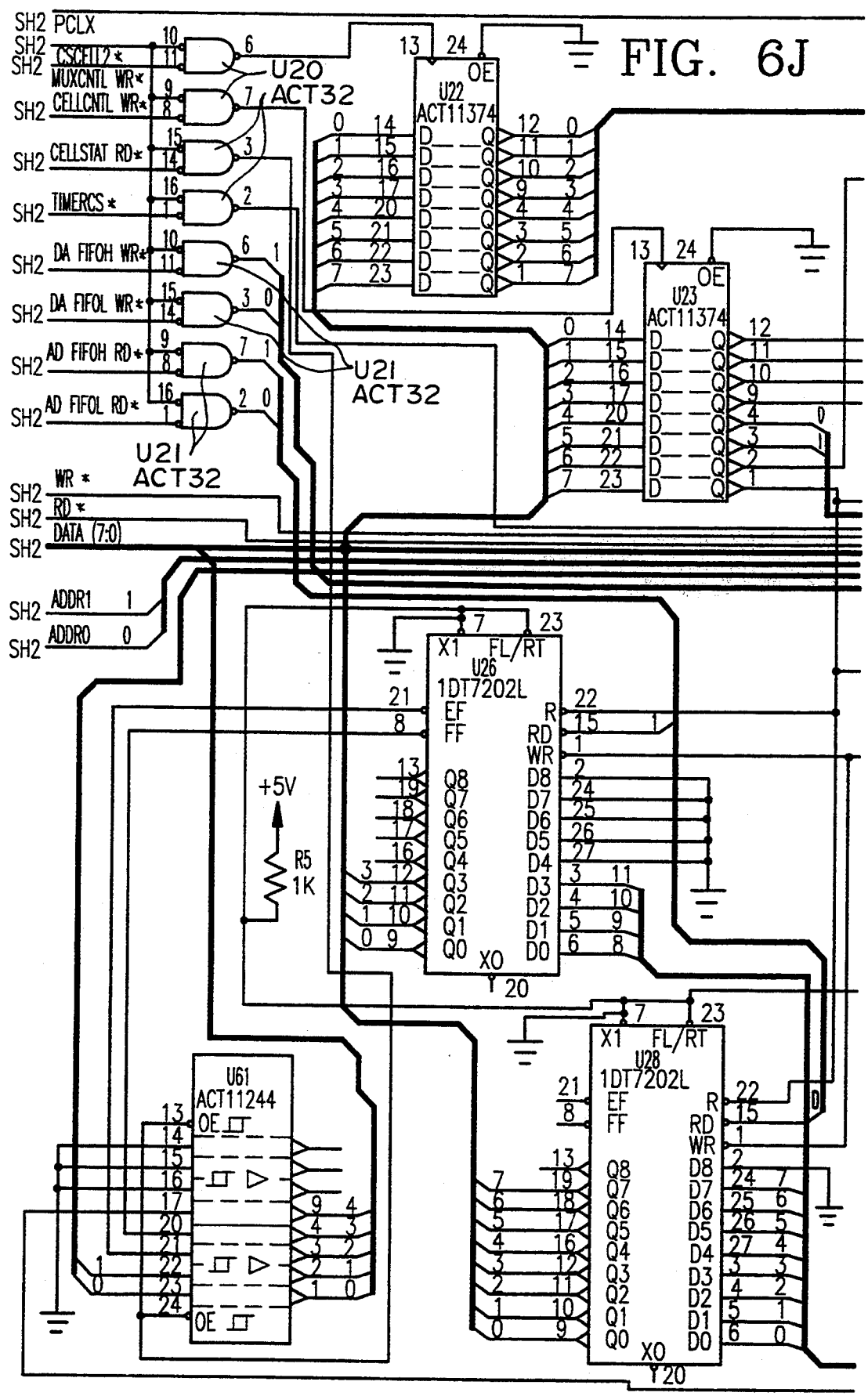
Figure 6K:
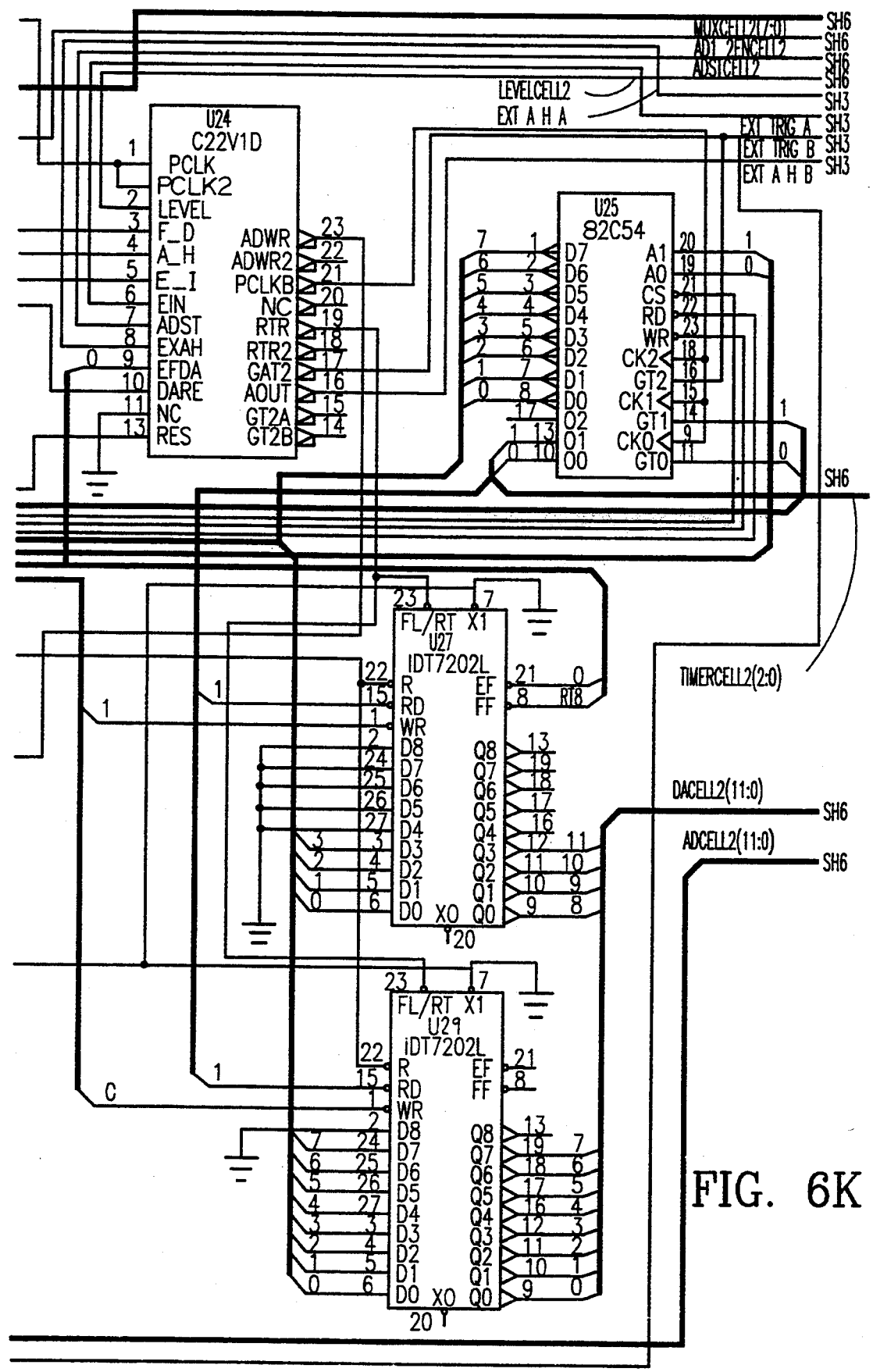
Figure 6L:
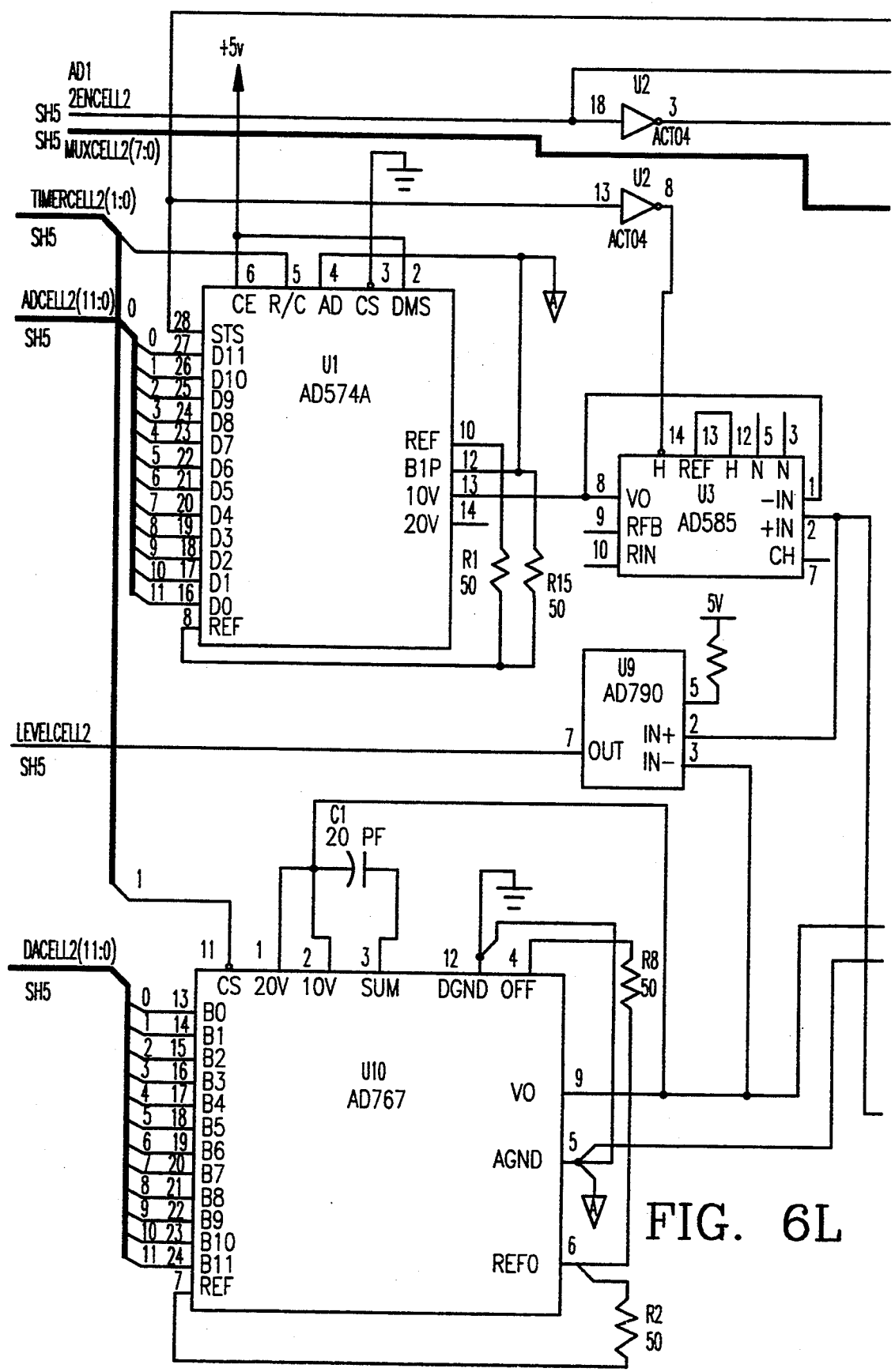
Figure 6M:
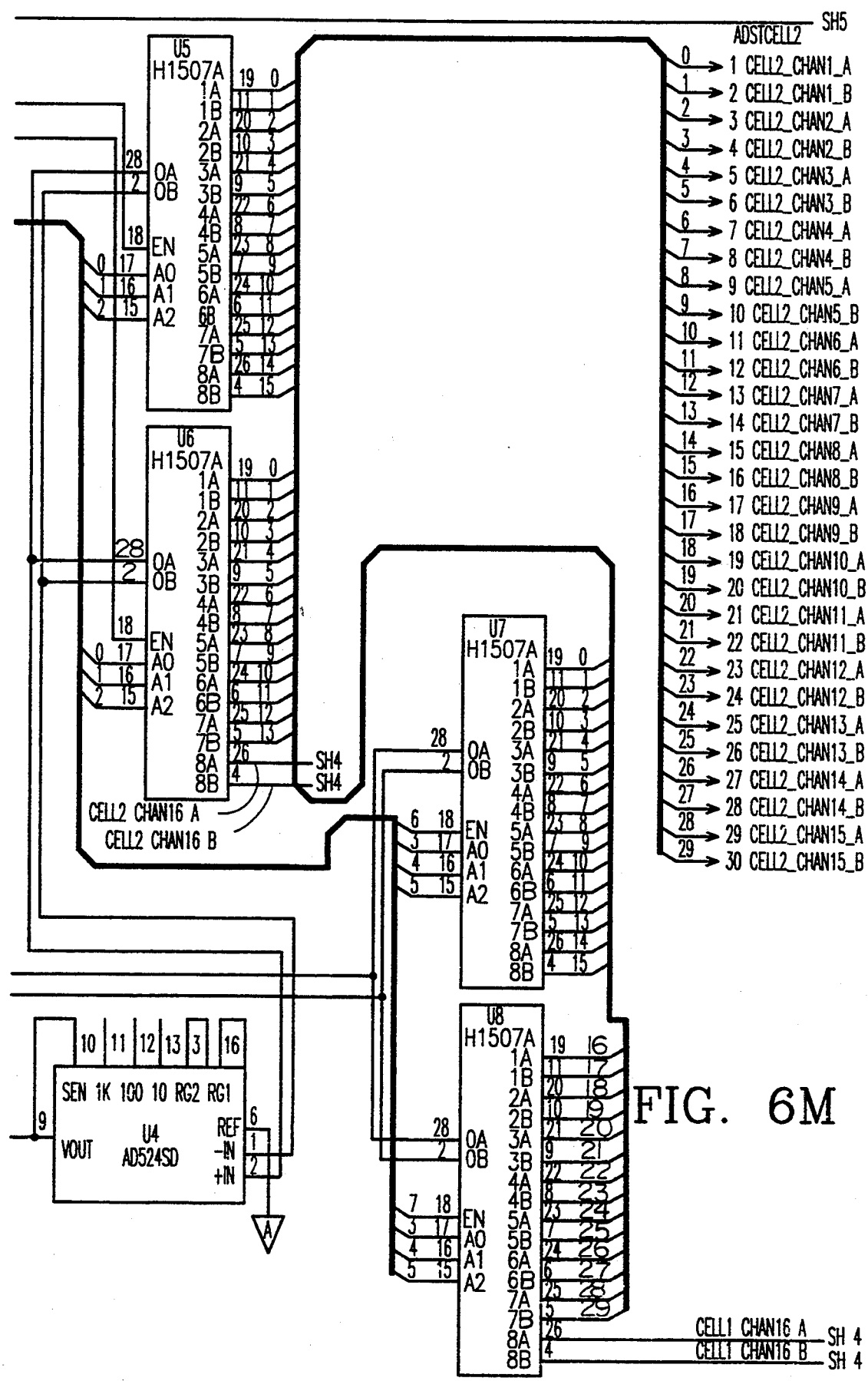

Referring now to FIG. 5, a sequence of steps for measuring the phase difference between two analog signals is shown. The phase difference can be represented by the time difference between a rising edge of the first signal, and the next rising edge of the second signal. In order to make this measurement, it is necessary to use both cells 15, 16. For purposes of illustration, it will be assumed, in the following discussion, that the first signal is an input to one of the channels of the first cell 15, and that the second signal is an input to one of the channels of the second cell 16. It will further be assumed that the phase measurement will be based on having the first signal leading the second signal. That is, the phase measurement will be made by first identifying a rising edge of the first signal, and then measuring how long it takes for the second signal to have a rising edge. Thus, the first cell 15 will be designated as the "lead cell," and the second cell 16 will be designated as the "lag cell." Because the two cells 15, 16 are identical, it will be recognized that the rolls of the first and second cells 15, 16 could easily have been reversed.

The phase measurement routine begins by initializing both cells 15, 16 in blocks 501 through 513. In block 501, the processor 10 sends control signals to the control means 20 of both the first and second cells 15, 16 in order to cause the cells 15, 16 to become inactive. This is necessary because several register values and operating modes must be initialized before making the phase difference measurement. If either of the cells 15, 16 were not made inactive, the danger exists that it would perform an action based on only a partial initialization of its resources.

Next, in block 502, the processor 10 initializes the mode and counter value of the lead cell's (i.e., first cell 15) D/A timer 30. As before, the term "mode" in this instance refers to the type of operation (e.g., count up, count down, count using an external trigger) as well as to the shape of the waveform that will be produced by the D/A timer 30. In the case of measuring phase difference, the D/A timer mode and counter values are set such that when the D/A conversion is enable, the D/A timer 30 will provide the necessary clock signal for the D/A converter 27 to clock in one value from the D/A FIFO 28.

In block 503, the processor 10 loads a digital value, corresponding to a threshold voltage, into the lead cell's D/A FIFO 28.

Next, in block 504, the processor 10 initializes the mode and counter value of the lag cell's (i.e., second cell 16) D/A timer 30. As before, the term "mode" in this instance refers to the type of operation (e.g., count up, count down, count using an external trigger) as well as to the shape of the waveform that will be produced by the D/A timer 30. In the case of measuring phase difference, the D/A timer mode and counter values are set such that when the D/A conversion is enabled, the D/A timer 30 will provide the necessary clock signal for the D/A converter 27 to clock in one value from the D/A FIFO 28.

In block 505, the processor 10 loads a digital value, corresponding to a threshold voltage, into the lag cell's D/A FIFO 28.

In block 506, the processor 10 sends a command to the lead cell's (first cell 15) control means 20, causing the D/A converter 27 to clock in and convert the digital value, previously loaded in the D/A FIFO 28, into an analog voltage. Because only one value is clocked in by the D/A converter 27, its output holds a constant D.C. voltage. This so-called "threshold voltage" is provided at one input of the lead cell's comparator 24.

In block 507, the processor 10 sends a command to the lag cell's (second cell 16) control means 20, causing the D/A converter 27 to clock in and convert the digital value, previously loaded in the D/A FIFO 28, into an analog voltage. Because only one value is clocked in by the D/A converter 27, its output holds a constant D.C. voltage. This so-called "threshold voltage" is provided at one input of the lag cell's comparator 24.

In block 508, the processor 10 causes the D/A converter 27 in the lead cell (first cell 15) to stop any further conversion operations. Then, in block 509, the processor 10 causes the D/A converter 27 in the lag cell (second cell 16) to stop any further conversion operations. The result of these operations is that the D/A converter 27 in each of the first and second cells 15, 16 will hold the threshold voltage that was clocked in during the respective execution of block 506 (lead cell) and block 507 (lag cell). This threshold voltage is used by each of the comparators 24 as a reference point against which the cell's input analog signal is compared in order to determine whether the analog signal is rising or falling.

Next, in block 510, the processor programs the lead cell (first cell 15) mode and counter value for the local comparator timer 29. For the phase difference measurement, the lead cell comparator timer 29 is initialized so that when the comparator 24 identifies a rising edge of the first analog signal, the comparator timer 29 will send a trigger to start a timer located in the lag cell (second cell 16). This trigger is communicated to the lag cell via the cell-to-cell bus.

Then, in block 511, the processor programs the lag cell (second cell 16) mode and counter value for the local comparator timer 29. For the phase difference measurement, the lag cell comparator timer 29 is initialized so that it will begin counting at a known rate when it receives the trigger sent by the lead cell (first cell 15), as described above with reference to block 510. The lag cell comparator timer 29 is further set up so that after it has begun counting (i.e., after it has received the above-described trigger from the lead cell), it will continue counting until the lag cell comparator 24 identifies a rising edge of the second analog signal, at which point the lag cell's comparator timer 29 stops counting.

Next, in blocks 512 and 513, the processor 10 causes the lead and lag cell multiplexors 21 to select the particular channel upon which the respective first and second analog signals are to appears. This completes the initialization phase of the phase difference measurement routine.

Execution of the routine then continues at blocks 514 and 515, where the processor 10 sends a phase difference measurement command to the control means 20 in each of the lead (first) and lag (second) cells 15, 16. Then, in blocks 516 and 517, the processor 10 puts the lag (second) cell 16 and then the lead (first) cell 15 in the active state to begin the actual measurement. Note that the lag cell (second cell 16) must be made active before the lead cell (first cell 15) is made active, because doing otherwise might cause the lead cell (first cell 15) to issue a trigger before the lag cell (second cell 16) is able to respond to it. During the active phase of operation, the analog signal present on the selected channel in the lead cell (first cell 15) appears at the output of the multiplexor 21. This signal is also present at one input of the comparator 24. As previously stated, the other input of the comparator is coupled to the D.C. threshold voltage coming out of the D/A converter 27. Thus, the comparator will produce a signal that indicates when the first analog signal becomes greater than the threshold voltage, and also when the analog signal to be measured becomes lower than the threshold voltage. As previously stated, the comparator timer 29 has been set up, during the initialization phase, to send a trigger to the corresponding timer in the lag cell (second cell 16) when the output of the comparator 24 indicates that the analog signal first becomes greater than the threshold voltage. This trigger causes the comparator counter 29 located in the lag cell (second cell 16) to begin counting. This counting continues until the output of the lag cell's (second cell 16) comparator 24 indicates that the second analog signal has risen above the level of the threshold voltage, at which point the lag cell's (second cell 16) comparator timer 29 stops its counting operation. The resulting count represents the phase difference between the first and second signals.

The program loop comprising blocks 518, 519, and 520, can now be understood. In block 518, the processor 10 executes a "readback" command to get the current counter value contained in the lag cell's (second cell 16) comparator timer 29. In block 519, the returned counter value is compared with the known initial value in order to detect whether or not counting has begun. If the two values are equal, then counting has not yet begun, and processor execution loops back to block 518. If the two values are not equal, then counting has started, indicating that the rising edge of the first signal has been identified by the lead cell (first cell 15). Processor execution then continues at block 520 to determine whether the counting operation has stopped. This is determined by comparing the present count with the value that was read during the immediately preceding pass through this same execution loop. If the two values are different, then counting is still going on, and the processor execution must jump back to block 518 to repeat the loop once again. If, however, the two values are the same, then the lag cell's (second cell 16) comparator timer 29 has stopped counting, indicating that a rising edge of the second analog signal has been identified. Execution then proceeds to block 521, where the timer count is converted to a phase measurement by multiplying it by the known time interval between successive counts. The processor may either store this value within the RAM 12 for local use, or it may up-load it to another processor (not shown) by means of the parallel communications port 19.

Also shown in block 521 is an operation in which the measured phase difference is compared to upper and lower expected limits. As described above with respect to other signal measurements, comparing the measured phase difference with expected upper and lower limits is useful for diagnosing problems within the analog built-in-test system.

The above description details how the processor 10 can control the cells 15, 16 to receive and generate signals in order to stimulate external circuits, and make measurements. It is also possible, however, to put the processor 10 in an inactive mode. In this mode, the cells 15, 16 may be controlled by an external processor (not shown) acting through either the parallel port 19, or the serial port 9.

It will be recognized by one skilled in the art that the scope of the invention is not limited by the above description of the preferred embodiment. Rather, the above is merely an example of one way of practicing the invention, the scope of which is defined by the following claims.

What is claimed is:

1. A diagnostic apparatus for testing an analog circuit, comprising:

a processor for generating control signals and for performing arithmetic operations;

a first cell having cell control means responsive to processor control signals for autonomously controlling the first cell, and input/output means for coupling to at least one external analog signal node;

a second cell having cell control means responsive to processor control signals for autonomously controlling the second cell, and input/output means for coupling to at least one external analog signal node;

a processor-cell bus including data and control lines, for coupling the processor to the cell control means of the first and second cells; and a cell-to-cell bus including data and control lines for coupling the first cell to the second cell;

wherein each cell inputs an analog signal from the at least one external analog signal node in response to a first control signal from the processor, and outputs an analog signal to the at least one external analog signal node in response to a second control signal from the processor, and wherein further the first cell sends a coordinating control signal that is received by the second cell by means of the cell-to-cell bus, the first cell's sending and the second cell's receiving of the coordinating control signal being in response to respective third and fourth control signals from the processor, wherein the receipt of the coordinating control signal by the second cell causes processing in the second cell to coordinate with processing in the first cell so as to produce a predetermined measurement of at least one analog signal.

2. A diagnostic apparatus according to claim 1 wherein each of the first and second cells further includes:
an analog to digital (A/D) converter coupled to receive an analog signal from the input/output means, and to transmit corresponding digital signals to the processor-cell bus;
a digital to analog (D/A) converter coupled to receive digital signals from the processor-cell bus, and to generate a corresponding analog signal which is coupled to the input/output means.

3. A diagnostic apparatus according to claim 2 wherein each of the first and second cells further includes an analog comparator coupled to receive a first analog signal from the input/output means, and a second analog signal from the D/A converter, and producing a comparison signal that is coupled to the processor-cell bus, the comparison signal being indicative of the relationship between the instantaneous magnitude of the first analog signal and the instantaneous magnitude of the second analog signal.

4. A diagnostic apparatus according to claim 3 wherein each of the first and second cells further includes a timer having a counter and an output coupled alternatively to the processor-cell or the cell-to-cell bus, and being responsive to timer control signals alternatively sent from the comparator, the processor or the cell control means.

5. A diagnostic apparatus according to claim 3 wherein each of the first and second cells further includes a timer that is responsive to timer control signals alternatively sent from the processor or the cell control means, wherein the timer has an output that is coupled to the A/D converter for controlling a sampling rate thereof.

6. A diagnostic apparatus according to claim 3 wherein each of the first and second cells further includes a timer that is responsive to timer control signals alternatively sent from the processor or the cell control means, wherein the timer has an output that is coupled to the D/A converter for controlling a conversion rate thereof.

7. A diagnostic apparatus according to claim 6 wherein each of the first and second cells further includes:
an input memory means for storing a plurality of data, the input memory means having an input coupled to the A/D converter output, and an output coupled to the processor-cell bus; and
an output memory means for storing a plurality of data, the output memory means having an input coupled to the processor-cell bus, and an output coupled to the input of the D/A converter.

8. A diagnostic apparatus according to claim 7 wherein the input memory means is a first-in-first-out (FIFO) memory device, and wherein further the output memory means is a second FIFO memory device.

9. A diagnostic apparatus according to claim 1 wherein the processing unit is further coupled to a parallel port for receiving commands, and for returning a command-dependent value.

10. A diagnostic apparatus according to claim 1 wherein the processing unit is further coupled to a serial port for receiving commands, and for returning a command-dependent value.

11. A diagnostic apparatus for testing an analog circuit, comprising:
a processor;
a first cell having cell control means responsive to processor control signals for autonomously controlling the first cell, and input/output means for coupling to at least one external analog signal node;
a second cell having cell control means responsive to processor control signals for autonomously controlling the second cell, and input/output means for coupling to at least one external analog signal node;
a processor-cell bus including data and control lines, for coupling the processor to the cell control means of the first and second cells; and
a cell-to-cell bus including data and control lines for coupling the first cell to the second cell;
wherein each cell inputs an analog signal from the at least one external analog signal node in response to a first control signal from the processor, and outputs an analog signal to the at least one external analog signal node in response to a second control signal from the processor, and wherein further the first cell sends an analog signal that is received by the second cell by means of the cell-to-cell bus, the first cell's sending and the second cell's receiving of the analog signal being in response to respective third and fourth control signals from the processor.

12. A diagnostic apparatus according to claim 11 wherein each of the first and second cells further includes:
an analog to digital (A/D) converter coupled to receive an analog signal from the input/output means, and to transmit corresponding digital signals to the processor-cell bus;
a digital to analog (D/A) converter coupled to receive digital signals from the processor-cell bus, and to generate a corresponding analog signal which is coupled to the input/output means.

13. A diagnostic apparatus according to claim 12 wherein each of the first and second cells further includes an analog comparator coupled to receive a first analog signal from the input/output means, and a second analog signal from the D/A converter, and producing a comparison signal that is coupled to the processor-cell bus, the comparison signal being indicative of the relationship between the instantaneous magnitude of the first analog signal and the instantaneous magnitude of the second analog signal.

14. A diagnostic apparatus according to claim 13 wherein each of the first and second cells further includes a timer having a counter and an output coupled alternatively to the processor-cell or the cell-to-cell bus, and being responsive to timer control signals alternatively sent from the comparator, the processor or the cell control means.

15. A diagnostic apparatus according to claim 13 wherein each of the first and second cells further includes a timer that is responsive to timer control signals alternatively sent from the processor or the cell control means, wherein the timer has an output that is coupled to the A/D converter for controlling a sampling rate thereof.

16. A diagnostic apparatus according to claim 13 wherein each of the first and second cells further includes a timer that is responsive to timer control signals alternatively sent from the processor or the cell control means, wherein the timer has an output that is coupled to the D/A converter for controlling a conversion rate thereof.

17. A diagnostic apparatus according to claim 16 wherein each of the first and second cells further includes:
an input memory means for storing a plurality of data, the input memory means having an input coupled to the A/D converter output, and an output coupled to the processor-cell bus; and
an output memory means for storing a plurality of data, the output memory means having an input coupled to the processor-cell bus, and an output coupled to the input of the D/A converter.

18. A diagnostic apparatus according to claim 17 wherein the input memory means is a first-in-first-out (FIFO) memory device, and wherein further the output memory means is a second FIFO memory device.

19. A diagnostic apparatus according to claim 11 wherein the processing unit is further coupled to a parallel port for receiving commands, and for returning a command-dependent value.

20. A diagnostic apparatus according to claim 11 wherein the processing unit is further coupled to a serial port for receiving commands, and for returning a command-dependent value.

21. The apparatus of claim 1, wherein the cell control means of the first cell includes means for causing the first cell to autonomously output a dynamically changing signal over a period of time without intervention by the processor.

22. The apparatus of claim 1, wherein the cell control means of the first cell includes means for causing the first cell to autonomously receive and store a plurality of measurements of a received dynamically changing signal, the receiving and storing operations taking place without intervention by the processor.

23. The apparatus of claim 1, wherein the cell control means of the first cell autonomously monitors an input signal over a period of time and changes a first cell status in dependence on the input signal satisfying a predetermined condition, the monitoring and changing operations taking place without intervention by the processor.

24. The apparatus of claim 11, wherein the cell control means of the first cell includes means for causing the first cell to autonomously output a dynamically changing signal over a period of time without intervention by the processor.

25. The apparatus of claim 11, wherein the cell control means of the first cell includes means for causing the first cell to autonomously receive and store a plurality of measurements of a received dynamically changing signal, the receiving and storing operations taking place without intervention by the processor.

26. The apparatus of claim 11, wherein the cell control means of the first cell autonomously monitors an input signal over a period of time and changes a first cell status in dependence on the input signal satisfying a predetermined condition, the monitoring and changing operations taking place without intervention by the processor.

* * * * *